US011250926B2

(12) United States Patent
Wu et al.

(10) Patent No.: US 11,250,926 B2
(45) Date of Patent: Feb. 15, 2022

(54) POSITIVE FEEDBACK AND PARALLEL SEARCHING ENHANCED OPTIMAL READ METHOD FOR NON-VOLATILE MEMORY

(71) Applicant: SanDisk Technologies LLC, Addison, TX (US)

(72) Inventors: Jianzhi Wu, Milpitas, CA (US); Xiang Yang, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 86 days.

(21) Appl. No.: 16/654,696

(22) Filed: Oct. 16, 2019

(65) Prior Publication Data

US 2021/0118518 A1    Apr. 22, 2021

(51) Int. Cl.
*G11C 29/38* (2006.01)
*G11C 16/26* (2006.01)
(Continued)

(52) U.S. Cl.
CPC .......... *G11C 29/38* (2013.01); *G06F 11/1068* (2013.01); *G11C 11/5628* (2013.01);
(Continued)

(58) Field of Classification Search
CPC ..... G11C 29/38; G11C 16/0483; G11C 16/10; G11C 16/08; G11C 11/5642; G11C 16/26;
(Continued)

(56) References Cited

U.S. PATENT DOCUMENTS 8,819,503 B2    8/2014   Melik-Martirosian
9,202,579 B2   12/2015   Hsiung et al.
(Continued)

FOREIGN PATENT DOCUMENTS

CN    107423160 A    12/2017
WO    2019147326 A1    8/2019

OTHER PUBLICATIONS

M. Yabuuchi, et al, "13.3 20nm High-density single-port and dual-port SRAMs with wordline-voltage-adjustment system for read/write assists," 2014 IEEE International Solid-State Circuits Conference Digest of Technical Papers (ISSCC), San Francisco, CA, USA, 2014, pp. 234-23 (Year: 2014).*

(Continued)

*Primary Examiner* — Cynthia Britt
(74) *Attorney, Agent, or Firm* — Dickinson Wright PLLC; Steven C. Hurles

(57) ABSTRACT

A non-volatile memory system and corresponding method of operation are provided. The system includes memory cells arranged in sectors. Each of the memory cells includes a control gate in communication with one of a plurality of word lines and a drain coupled to one of a plurality of bit lines and is configured to retain a threshold voltage. A control circuit is in communication with the memory cells and is configured to read the threshold voltage of each of the memory cells using default read parameters. The control circuit determines whether reading the non-volatile memory cells using the default read parameters is successful. The control circuit dynamically tests and adjusts read parameters based on whether reading the memory cells using the read parameters is successful in response to determining that reading the memory cells using the default read parameters is not successful.

20 Claims, 21 Drawing Sheets

(51) Int. Cl.
*G11C 16/04* (2006.01)
*G11C 16/08* (2006.01)
*G11C 16/24* (2006.01)
*G11C 29/52* (2006.01)
*G11C 11/56* (2006.01)
*G11C 16/10* (2006.01)
*G06F 11/10* (2006.01)

(52) U.S. Cl.
CPC ...... *G11C 11/5642* (2013.01); *G11C 11/5671* (2013.01); *G11C 16/0483* (2013.01); *G11C 16/08* (2013.01); *G11C 16/10* (2013.01); *G11C 16/24* (2013.01); *G11C 16/26* (2013.01); *G11C 29/52* (2013.01)

(58) Field of Classification Search
CPC . G11C 29/52; G11C 11/5628; G11C 11/5671; G11C 16/24; G11C 2211/5621; G11C 29/021; G11C 29/028; G11C 7/04; G06F 11/1068; G06F 11/1048; G06F 11/108
See application file for complete search history.

(56) References Cited

U.S. PATENT DOCUMENTS

| | | |
|---|---|---|
| 9,720,754 B2 | 8/2017 | Karakulak et al. |
| 10,026,483 B1 | 7/2018 | Shah et al. |
| 10,304,559 B2 | 5/2019 | Naik et al. |
| 10,446,242 B2 | 10/2019 | Achtenberg et al. |
| 2010/0074014 A1 | 3/2010 | Dunga et al. |
| 2012/0250420 A1* | 10/2012 | Shirakawa ......... G11C 16/0483 365/185.22 |
| 2014/0215133 A1* | 7/2014 | Seo .................... G06F 12/0246 711/103 |
| 2014/0269070 A1 | 9/2014 | Hsiung et al. |
| 2014/0359202 A1 | 12/2014 | Sun et al. |
| 2015/0006983 A1* | 1/2015 | Lin ...................... G11C 16/26 714/721 |
| 2017/0365349 A1* | 12/2017 | Pang .................... G11C 16/26 |
| 2019/0303239 A1* | 10/2019 | Hsiao .................. G06F 3/0616 |
| 2019/0324688 A1 | 10/2019 | Kang |

OTHER PUBLICATIONS

International Search Report and Written Opinion, PCT/US2020/024214 dated Dec. 8, 2020.

* cited by examiner

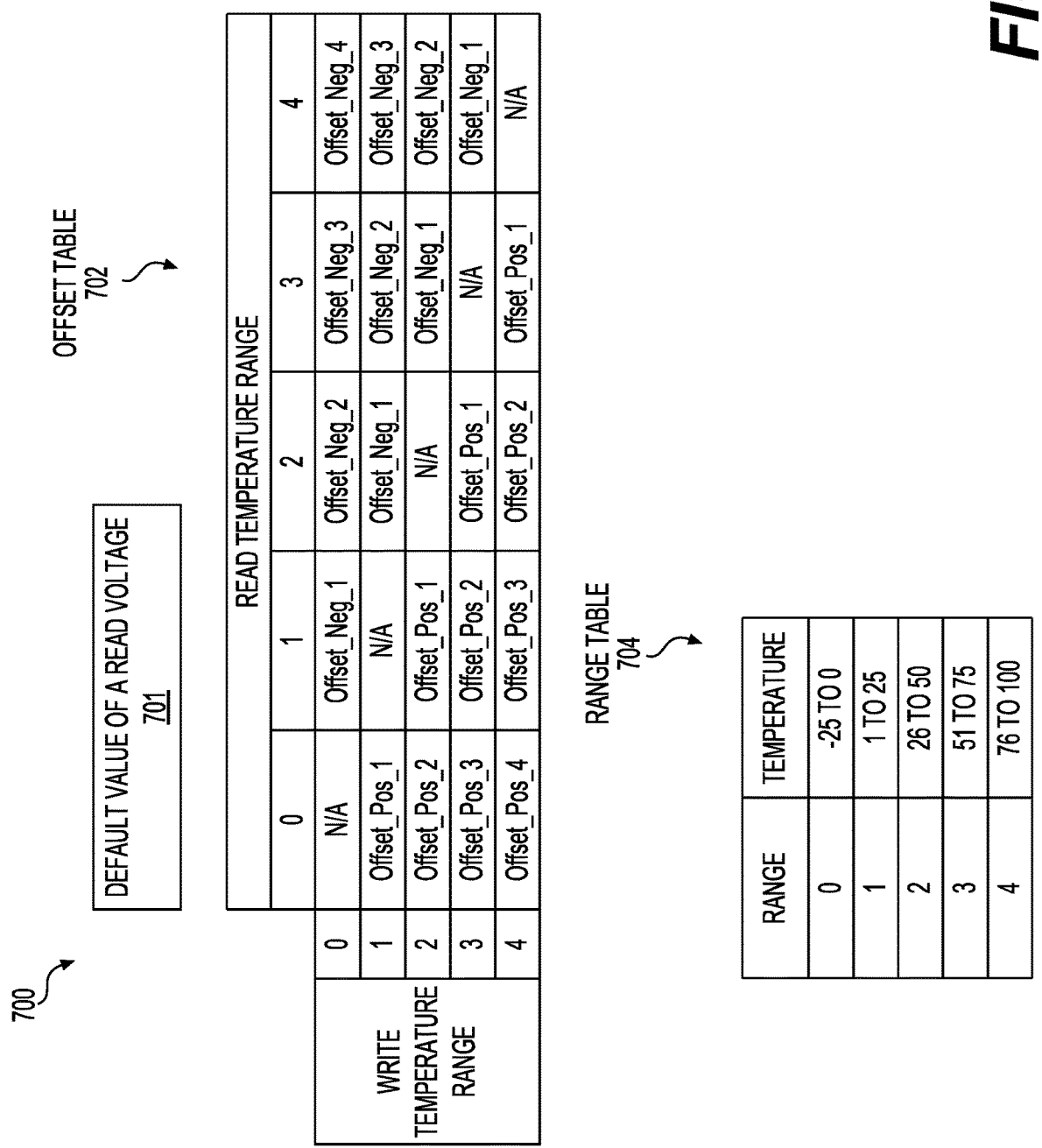

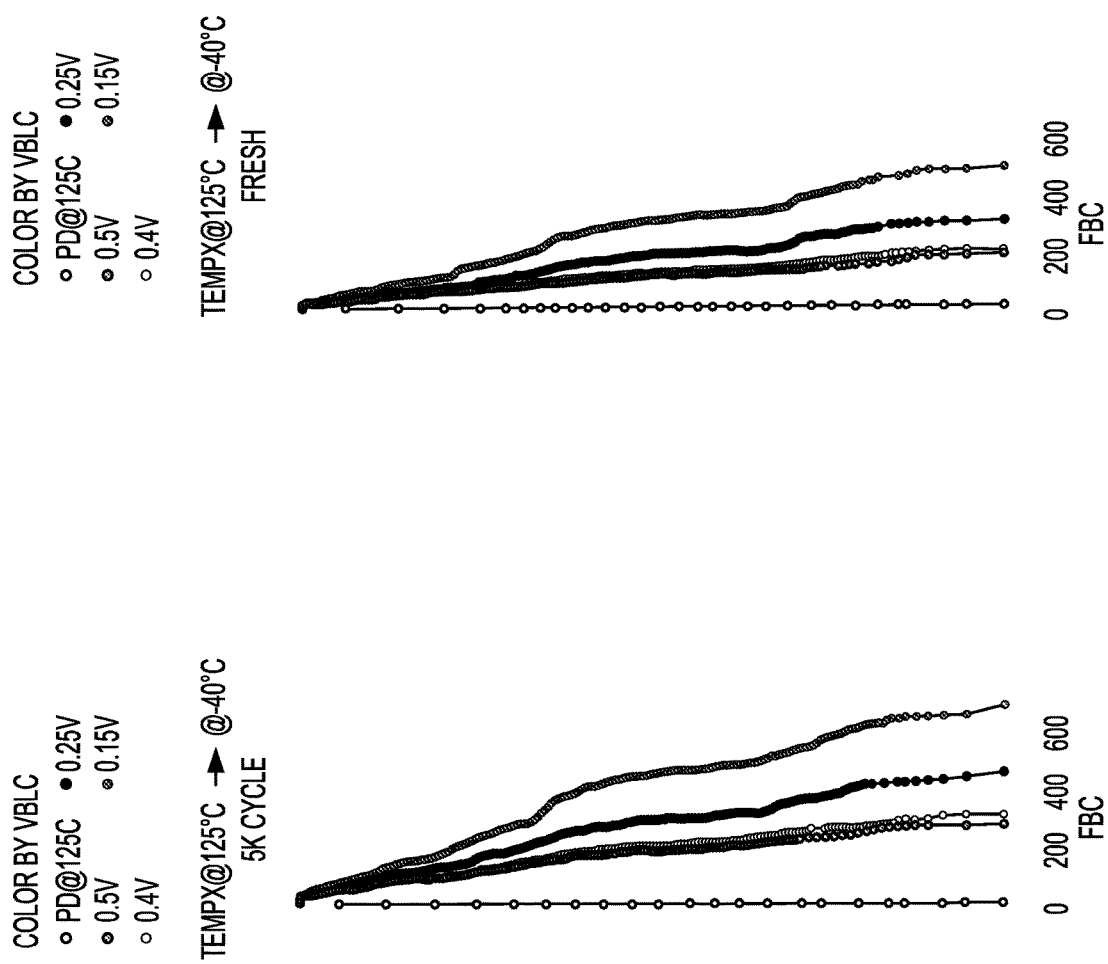

POSITIVE FEEDBACK AND PARALLEL SEARCHING ENHANCED OPTIMAL READ METHOD FOR NON-VOLATILE MEMORY

FIELD

This application relates to the operation of re-programmable non-volatile memory systems such as semiconductor flash memory, and, more specifically, to non-volatile memory systems employing a positive feedback and parallel enhanced optimal read method.

BACKGROUND

This section provides background information related to the technology associated with the present disclosure and, as such, is not necessarily prior art.

A charge-storing material such as a conductive floating gate or a non-conductive charge-trapping material can be used in some types of memory cells of semiconductor memory devices to store a charge which represents a data state. The memory cell may be a transistor in which the charge storing material may reside between a channel and a control gate. The charge-storing material may be insulated from both the channel and the control gate. The charge-storing material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

Some types of memory cells may be programmed by altering the charge in the charge-storing material, thereby altering the threshold voltage ($V_{TH}$) of the memory cell transistor. In one technique, a program voltage is applied to the control gate with a low voltage in the channel to add charge to the charge-storing material. After applying the program voltage, the memory cell's threshold voltage is tested by applying a verify voltage to the control gate, and testing whether the memory cell conducts a significant current. Additional program voltages may be applied to control gate, followed by verify voltages, until the memory cell's threshold current is within a target range.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Semiconductor memory devices have become more popular for use in various electronic devices. For example, non-volatile semiconductor memory is used in cellular telephones, digital cameras, personal digital assistants, mobile computing devices, non-mobile computing devices and other devices. In addition, semiconductor memory devices are increasingly being used in vehicles that require operation in extreme environmental conditions. Consequently, it is preferable that such semiconductor memory devices deliver dependable performance even in extreme conditions (e.g., −40° C. and up to 125° C.). Nevertheless, memory systems may encounter high Failure Bit Count (FBC) when writing or programming at one temperature and reading at a significantly different temperature, for example. While such memory systems frequently employ error correcting code (ECC) to help ameliorate read errors that may result from wide ranges of temperatures, such error correcting code typically has limited ability to correct errors.

Accordingly, there is still a need for more improved non-volatile memory systems while providing adequate performance and durability.

SUMMARY

This section provides a general summary of the present disclosure and is not a comprehensive disclosure of its full scope or all of its features and advantages.

An object of the present disclosure is to provide a non-volatile memory system and a method of operating the non-volatile memory system that address and overcome the above-noted shortcomings.

Accordingly, it is an aspect of the present disclosure to provide an apparatus including a plurality of non-volatile memory cells and a control circuit in communication with the plurality of non-volatile memory cells. The control circuit is configured to read a threshold voltage of each of the plurality of non-volatile memory cells using a plurality of read parameters being a plurality of default read parameters. The control circuit determines whether reading the plurality of non-volatile memory cells using the plurality of default read parameters is successful. The control circuit dynamically tests and adjusts the plurality of read parameters based on whether reading the plurality of non-volatile memory cells using the plurality of read parameters is successful until the plurality of read parameters is determined to result in a successful read in response to determining that reading the plurality of non-volatile memory cells using the plurality of default read parameters is not successful.

According to another aspect of the disclosure, a controller in communication with a plurality of non-volatile memory cells of a non-volatile memory system is provided. The controller is configured to instruct the non-volatile memory system to read a threshold voltage of each of the plurality of non-volatile memory cells using a plurality of read parameters being a plurality of default read parameters. The controller is also configured to receive data from the non-volatile memory system corresponding to reading the threshold voltage of each of the plurality of non-volatile memory cells using the plurality of default read parameters. In addition, the controller is configured to determine whether reading the plurality of non-volatile memory cells using the plurality of default read parameters is successful. The controller then is configured to instruct the non-volatile memory system to dynamically test and adjust the plurality of read parameters based on whether reading the plurality of non-volatile memory cells using the plurality of read parameters is successful until the plurality of read parameters is determined to result in a successful read in response to determining that reading the plurality of non-volatile memory cells using the plurality of default read parameters is not successful.

According to yet another aspect of the disclosure, a method of operating a plurality of non-volatile memory cells of non-volatile memory system is also provided. The method includes the step of reading a threshold voltage of each of the plurality of non-volatile memory cells using a plurality of read parameters being a plurality of default read parameters. The next step of the method is determining whether reading the plurality of non-volatile memory cells using the plurality of default read parameters is successful. The method also includes the step of dynamically testing and adjusting the plurality of read parameters based on whether reading the plurality of non-volatile memory cells using the plurality of read parameters is successful until the plurality of read parameters is determined to result in a successful read in response to determining that reading the plurality of non-volatile memory cells using the plurality of default read parameters is not successful.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 9 is a diagram illustrating a particular example of tables that may be used by the non-volatile memory system of FIG. 1 according to aspects of the disclosure;

FIGS. 13A-13F show a series of probability vs. failure bit count graphs for multiple sets of cycles of the memory system using example bit line voltages according to aspects of the disclosure;

DETAILED DESCRIPTION

Figure 1:
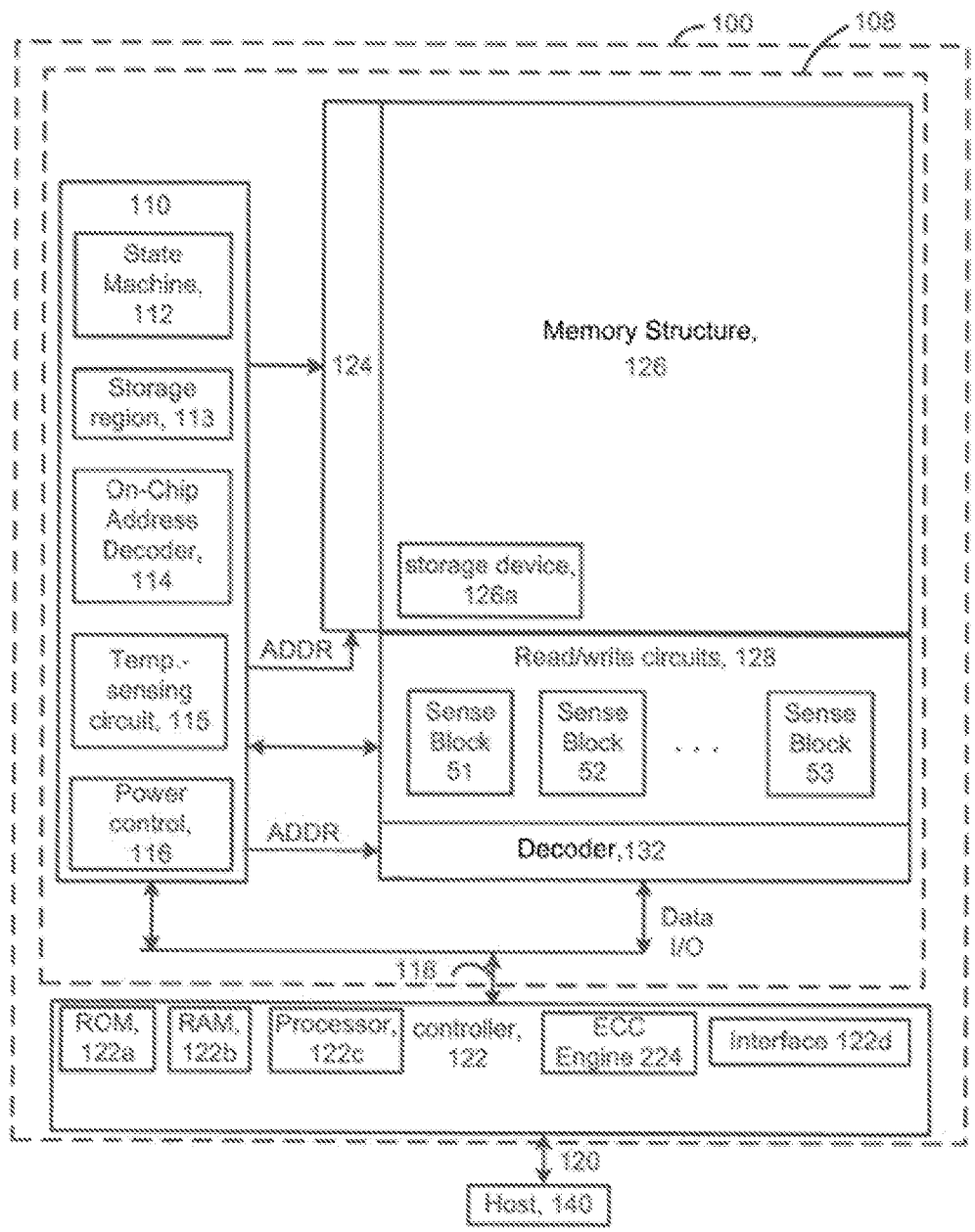
FIG. 1 is a functional block diagram of a non-volatile memory system in which embodiments may be practiced according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory systems of the type well-suited for use in many applications. The non-volatile memory system and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

With the recent advancement of autonomous vehicles, for example, a significantly growing number of vehicles are connected thus generating significant amounts of data that needs to be stored in memory devices. As a result, embedded flash storage product are aiming to deliver dependable performance even in extreme conditions in and around the vehicle, including wide ambient temperatures range (e.g., −40° C. and up to 125° C.). Thus, robust embedded flash drives or other memory systems capable of operating in a wide range of connected automotive systems and environments are ideal.

Some available non-volatile memory systems exhibit very high Fail Bit Count (FBC) for the temperature cross from 125° C. to −40° C. when large sample size (~50 dies) are being qualified. Such high FBC is typically beyond the Error-Correcting Code (ECC)'s capability, thus resulting in unacceptable reading errors. One known root cause is that some "outlier" dies show marginal channel current in extreme conditions (e.g., −40° C.), causing string or chain cut-off at low temperature. This marginal channel current in the outlier dies can be addressed by setting default bit line voltage to a higher value, which leads to an extensive increase in channel current for majority dies (the dies besides the outlier dies). In addition, high bit line voltage on the majority dies can severely degrade subthreshold slope of cells, leading to more sensing noise. Thus, such an approach may fall short of covering sufficient temperature range and sample size.

Additionally, due to process variation, die to die variation is inevitable even with maturing technology. For example, poly-channel quality control through poly-slim process is an effective approach to improve temperature cross, natural threshold voltage, as well as device performance. However, even though a slimming target, for instance, is 6.0 nm, some dies in the same wafer may be slimmed by 6.5 nm and some dies may be slimmed by 5.5 nm (assuming process margin is ±0.5 nm). As a result, dies with 5.5 nm slimming always show worse temperature cross behavior than a typical 6.0 nm slimming. Such a situation does not typically lend itself to the use of unified/predefined cross temperature coefficient parameters to compensate die-to-die variation. Under extreme condition (e.g., −40° C.), device parameters optimized for the typical 6.0 nm would lead to read failures for 5.5 nm "outlier" dies.

One method to help compensate for such significant temperature cross is known as "Dynamic Read" (also known as "optimal read"). This method applies a set of different word line biases or word line voltages based on temperature according to a "dynamic read table" and picks out the best case as the final results.

FIG. 1 is a block diagram of an example memory system 100 in which embodiments may be practiced. The memory system 100, such as a non-volatile storage system, may include one or more memory die 108. The memory die 108 includes a memory structure 126 of non-volatile memory cells 127 (FIG. 3B), such as an array of memory cells, control circuitry or control circuit 110, and read/write circuits 128. The memory structure 126 is addressable by word lines via a row decoder 124 and by bit lines via a column decoder 132. The read/write circuits 128 include multiple sense modules or blocks 51, 52, . . . 53 (sensing circuitry) and allow a page of memory cells to be read or programmed in parallel. Typically a controller 122 is included in the same memory system 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The control circuitry 110 may include a temperature-sensing circuit 115 which may be used by the state machine 112 to determine a present temperature. In one embodiment, the temperature-sensing circuit 115 outputs a temperature code, which may be a binary string. The temperature-sensing circuit 115 senses a temperature at which memory cells on a selected word line are programmed. A storage region 113 contains registers for storing the temperature codes or other information, at least temporarily.

Figure 3B:
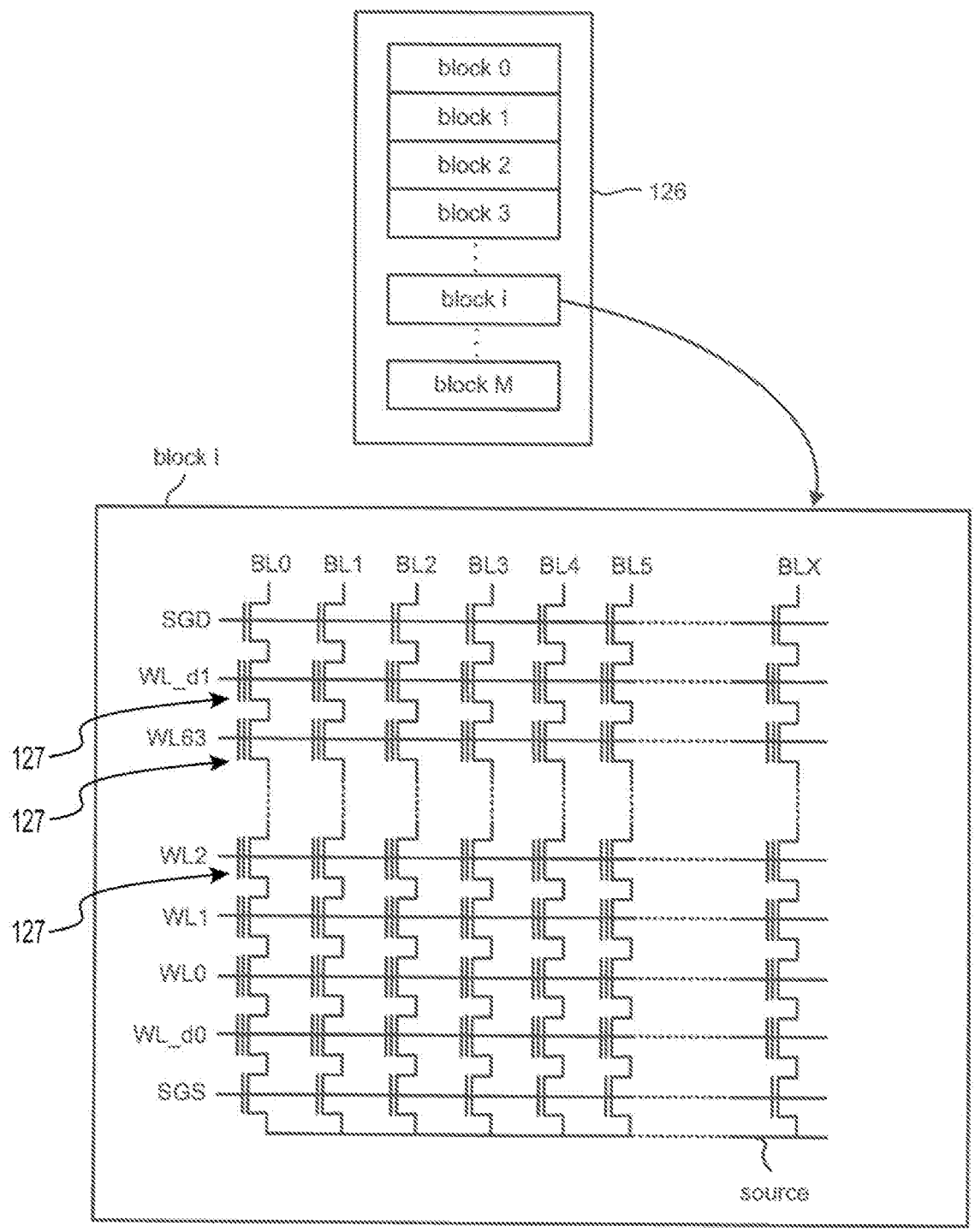
FIG. 3B depicts an exemplary structure of a memory cell array according to aspects of the disclosure.
Figure 4:
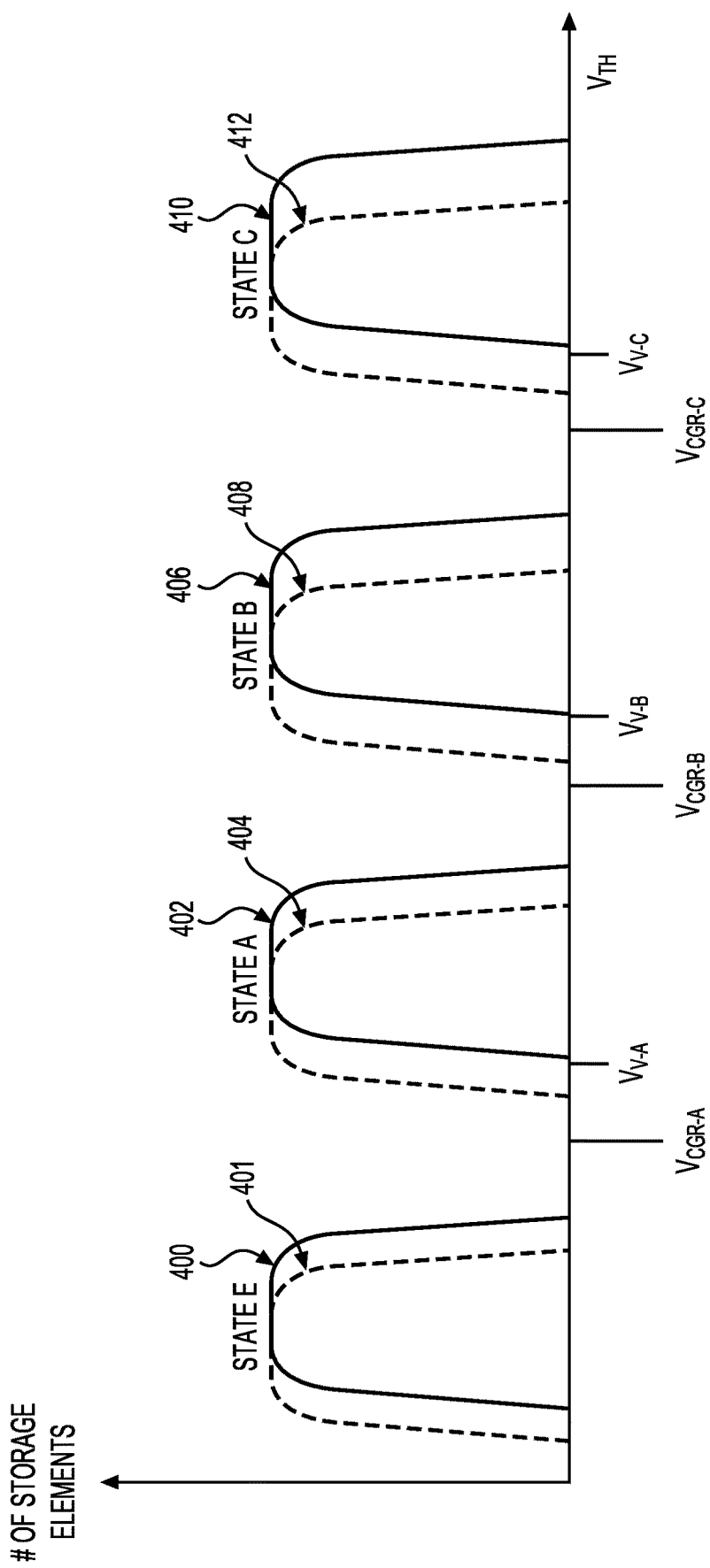
FIG. 4 depicts a threshold voltage distribution according to aspects of the disclosure.

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks or modules can include bit line drivers, in one approach. An SGS transistor is a select gate transistor at a source end of a NAND string, and an SGD transistor is a select gate transistor at a drain end of the NAND string (FIGS. 3B and 4). In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth. The control circuit may also be referred to as a managing circuit.

The off-chip controller 122 (which in one embodiment is an electrical circuit) may comprise a processor 122c, storage devices (memory) such as ROM 122a and RAM 122b and an error-correction code (ECC) engine 224. The ECC engine 224 can correct a number of read errors.

A memory interface 122d may also be provided. The memory interface, in communication with ROM, RAM and processor 122c, is an electrical circuit that provides an electrical interface between controller 122 and memory die. For example, the memory interface 122d can change the format or timing of signals, provide a buffer, isolate from surges, latch I/O and so forth. The processor 122c can issue commands to the control circuitry 110 (or any other component of the memory die) via the memory interface 122d.

The storage device comprises code such as a set of instructions, and the processor 122c is operable to execute the set of instructions to provide the functionality described herein. Alternatively or additionally, the processor 122c can access code from a storage device 126a of the memory structure 126, such as a reserved area of memory cells in one or more word lines. The control circuit 110 can, for example, be implemented in the non-volatile memory system 100 itself, or carried out by the controller 122 in communication with the memory structure 126.

For example, code can be used by the controller 122 to access the memory structure 126 such as for programming, read and erase operations. The code can include boot code and control code (e.g., a set of instructions). The boot code is software that initializes the controller 122 during a booting or startup process and enables the controller 122 to access the memory structure. The code can be used by the controller 122 to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host 140 is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Figure 7:
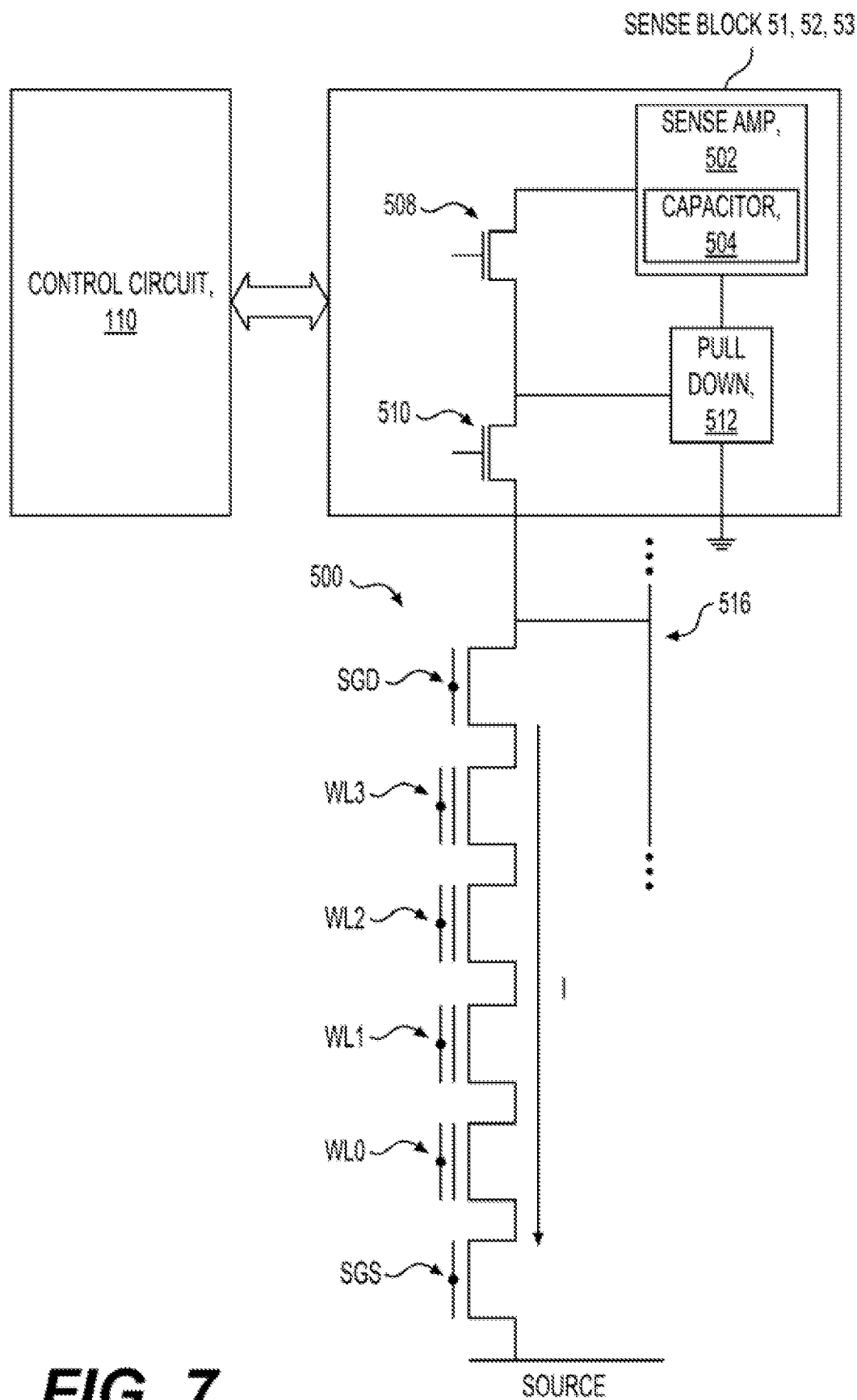
FIG. 7 depicts a configuration of a NAND string and components for sensing according to aspects of the disclosure.

Multiple memory elements may be configured so that they are connected in series or so that each element is individually accessible. By way of non-limiting example, flash memory devices in a NAND configuration (NAND memory) typically contain memory elements connected in series (FIGS. 3B and 7). A NAND string is an example of a set of series-connected transistors comprising memory cells and SG transistors.

A NAND memory array may be configured so that the array is composed of multiple strings of memory in which a string is composed of multiple memory elements (e.g., plurality of non-volatile memory cells 127) sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate). In one embodiment, vertically orientated NAND strings extend perpendicular to the major surface of the substrate.

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2A:
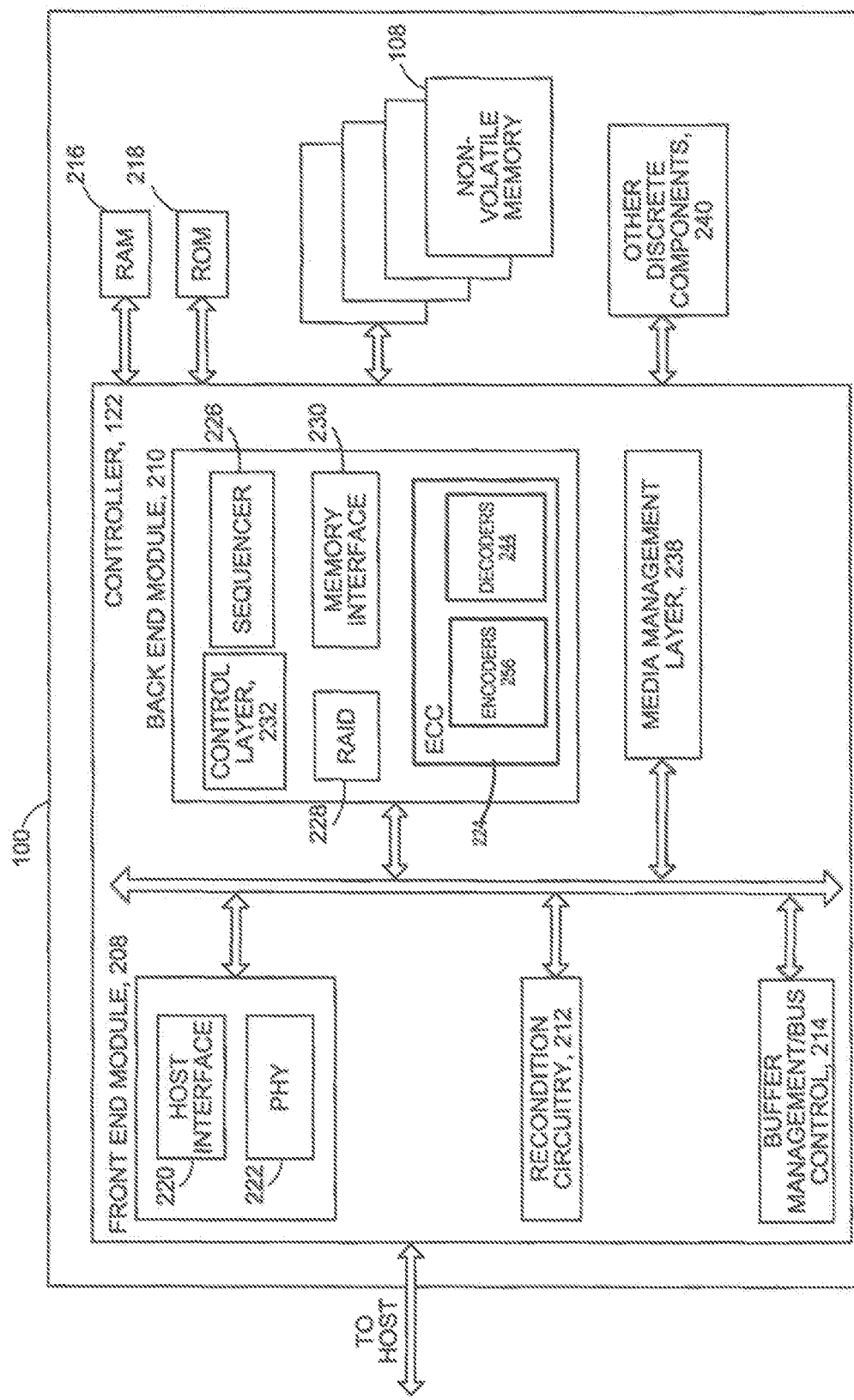
FIG. 2A is a block diagram of the example non-volatile memory system depicting additional details of a controller of the non-volatile memory system of FIG. 1 according to aspects of the disclosure.

FIG. 2A is a block diagram of the example memory system 100, depicting additional details of the controller 122. In one embodiment, the controller 122 is a flash controller. As used herein, a memory controller is a device that manages data stored on memory and communicates with a host 140 (FIG. 1), such as a computer or electronic device. A memory controller can have various functionality in addition to the specific functionality described herein. For example, the memory controller can format the memory to ensure the memory is operating properly, map out bad memory cells, and allocate spare memory cells to be substituted for future failed cells. Some part of the spare cells can be used to hold firmware to operate the memory controller and implement other features. In operation, when a host needs to read data from or write data to the memory, it will communicate with the memory controller. If the host 140 provides a logical address to which data is to be read/written, the memory controller can convert the logical address received from the host to a physical address in the memory. (Alternatively, the host 140 can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable interface. In one embodiment, memory system 100 may be a card based system, such as a secure digital (SD) or a micro secure digital (micro-SD) card. In an alternate embodiment, the memory system may be part of an embedded memory system. For example, the memory may be embedded within the host, such as in the form of a solid state disk (SSD) drive installed in a personal computer.

In some embodiments, the memory system 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller 122 may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2A is one example implementation that may (or may not) use the components of the controller 122 depicted in FIG. 1 (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2A as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. The ECC engine 224 has one or more decoders 244 and one or more encoders 256. In one embodiment, the ECC engine 224 comprises a low-density parity check (LDPC) decoder. In one embodiment, the decoders 244 include a hard decoder and a soft decoder. An output of one or more decoders 244 may be provided to the host.

A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A control layer 232 controls the overall operation of back end module 210.

Additional components of memory system 100 include media management layer 238, which performs wear leveling of memory cells of non-volatile memory die 108. The memory system 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Media Management Layer (MML) 238 may be integrated as part of the management that may handle errors and interfacing with the host. In one embodiment, MML 238 is a Flash Translation Layer (FTL). MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In one embodiment, the controller and multiple memory dies (together comprising the memory system 100) implement a solid state drive (SSD), which can emulate, replace or be used instead of a hard disk drive inside a host, as a network-attached storage (NAS) device, and so forth. Additionally, the SSD need not be made to work as a hard drive.

Figure 2B:
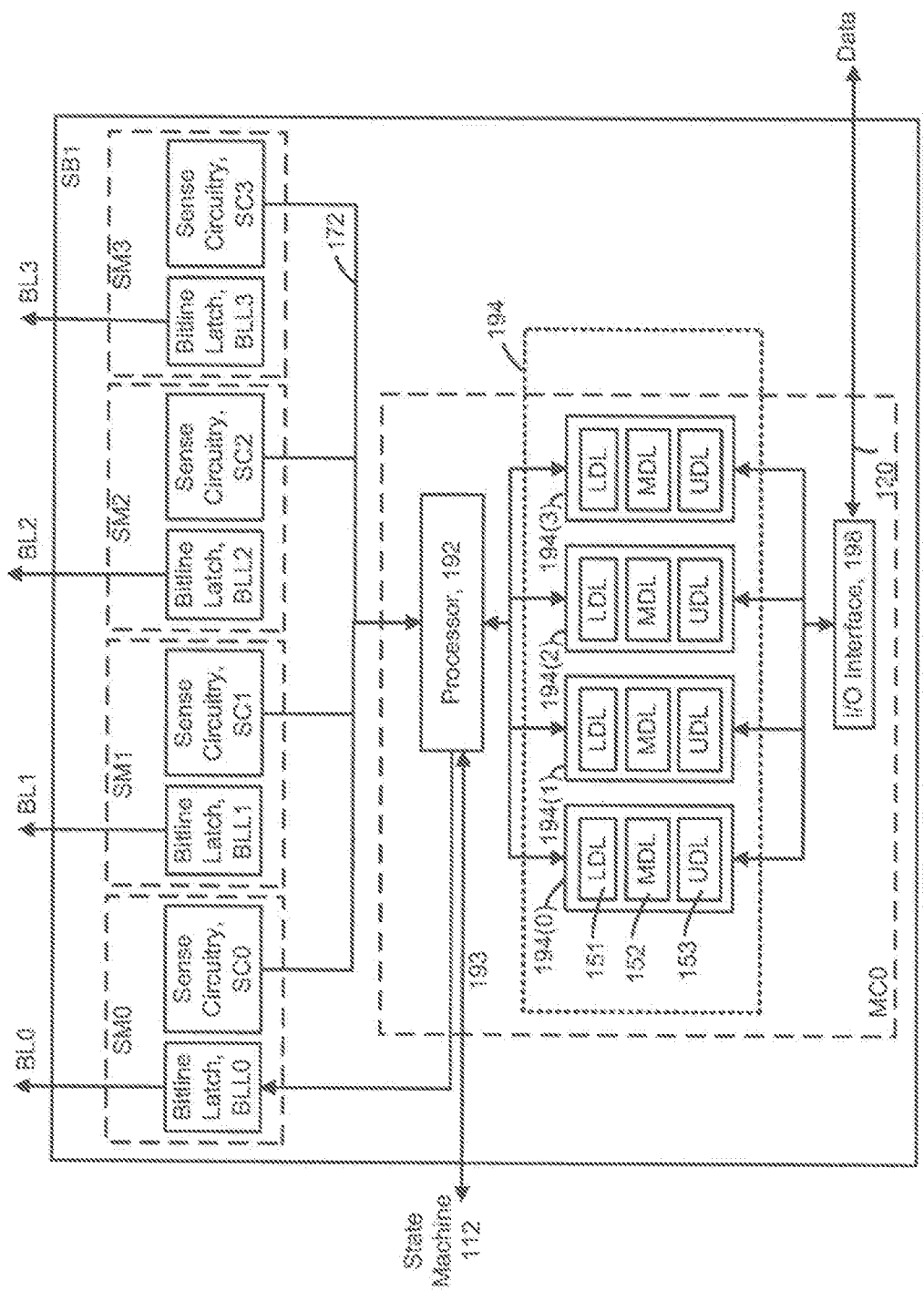
FIG. 2B is a block diagram depicting one embodiment of a sense block according to aspects of the disclosure.

FIG. 2B is a block diagram depicting one embodiment of one of the sense blocks or modules (e.g., SB 51) of FIG. 1A. The sense block is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 comprises sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming voltage, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 comprises a processor 192, four example sets of data latches 194(0), 194(1), 194(2) and 194(3) and an I/O interface 198 coupled between the sets of data latches 194 and the data bus 120. In this example, each set of latches is associated with one of the bit lines. For example, data latches 194(0) are associated with bit line BL0, data latches 194(1) are associated with bit line BL1, data latches 194(2) are associated with bit line BL2, and data latches 194(3) are associated with bit line BL3. Each set of data latches includes data latches identified by LDL 151, MDL 152, and UDL 153, in this embodiment. LDL 151 stores a bit for a lower page (LP) of write data, MDL 152 stores a bit for a middle page (MP) of write data, and UDL 153 stores a bit for an upper page (UP) of write data, in a memory which stores three bits of data in each memory cell. Note that there may be one set of such latches associated with each bit line. Thus, there may be a page of latches 194 associated with a page of memory cells. The latches 194 may also be used to store data read from the non-volatile memory cells.

Additional or fewer data latches per set could be used as well. For example, in a two-bit per memory cell implementation, the MDL data latch for the middle page (MP) of data is not needed. The processor 192 performs computations during reading and programming. For reading, the processor determines the data state stored in the sensed memory cell and stores the data in the set of data latches. For full programming and refresh programming, the processor reads the latches to determine the data state which is to be written to a memory cell.

During reading, the operation of the system is under the control of the state machine 112 which controls the supply of different control gate voltages to the addressed memory cell. As it steps through the various predefined control gate voltages (e.g., $V_{CGR-A}$, $V_{CGR-B}$ and $V_{CGR-C}$ in FIG. 5) corresponding to the various memory states supported by the memory (e.g., states A, B, and C), the sense module may trip at one of these voltages and a corresponding output will be provided from the sense module to the processor 192 via the data bus 172. At that point, processor 192 determines the memory state by consideration of the tripping event(s) of the sense module and the information about the applied control gate voltage from the state machine via input lines 193. It then computes a binary encoding for the memory state and stores the resultant data bits into the data latches 194. For example, the memory state for a memory cell associated with bit line BL0 may be stored in latches 194(0), etc. In another embodiment of the managing circuit MC0, the bit line latch serves both as a latch for latching the output of the sense module and also as a bit line latch as described above.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense modules, the state machine needs to read the wired-OR line four times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the data latches 194 from the data bus 120, in the LDL, MDL, and UDL data latches. For example, the data to be programmed in a selected memory cell associated with bit line BL0 may be stored in latches 194(0), the data to be programmed in a selected memory cell associated with bit line BL1 may be stored in latches 194(1), etc. The programming operation, under the control of the state machine, comprises a series of programming voltage pulses (FIG. 6) applied to the control gates of the addressed memory cells. Each programming voltage is followed by a read back (verify test) to determine if the memory cell has been programmed to the desired memory state. In some cases, processor monitors the read back memory state relative to the desired memory state. When the two states agree, the processor sets the bit line latch to cause the bit line to be pulled to a state designating program inhibit (e.g., 2-3 V). This inhibits the memory cell coupled to the bit line from further programming even if programming voltages appear on its control gate. In other embodiments, the processor initially loads the bit line latch and the sense circuitry sets it to an inhibit value during the verify process.

Each set of data latches 194 may be implemented as a stack of data latches for each sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 3A:
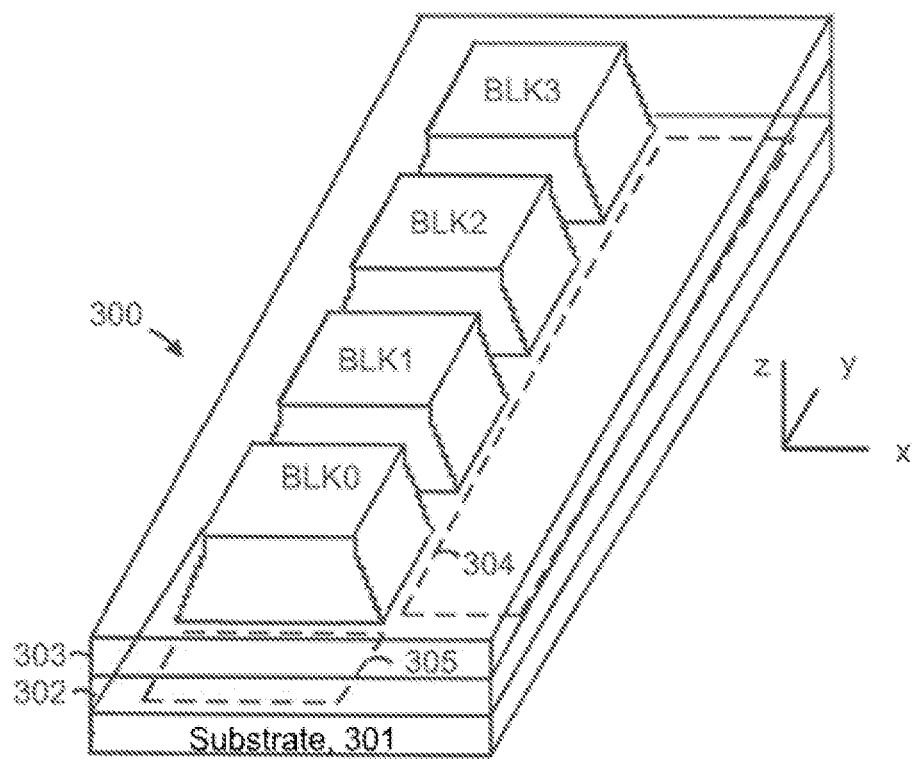
FIG. 3A is a perspective view of a memory device comprising a set of blocks in an example 3D configuration of the non-volatile memory system of FIG. 1 according to aspects of the disclosure.

FIG. 3A is a perspective view of a memory device 300 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The substrate has a major surface that extends in the x-y plane. The blocks may be formed over the major surface. The peripheral area 304 runs along an edge of each block while the peripheral area 305 is at an end of the set of blocks. Each peripheral area can include circuitry, including but not limited to voltage drivers which can be connected to control gate layers, bit lines and source lines of the blocks.

The substrate 301 can also carry circuitry under the blocks, along with one or more lower metal layers which are patterned in conductive paths to carry signals of the circuitry. The blocks are formed in an intermediate region 302 of the memory device. In an upper region 303 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 11:
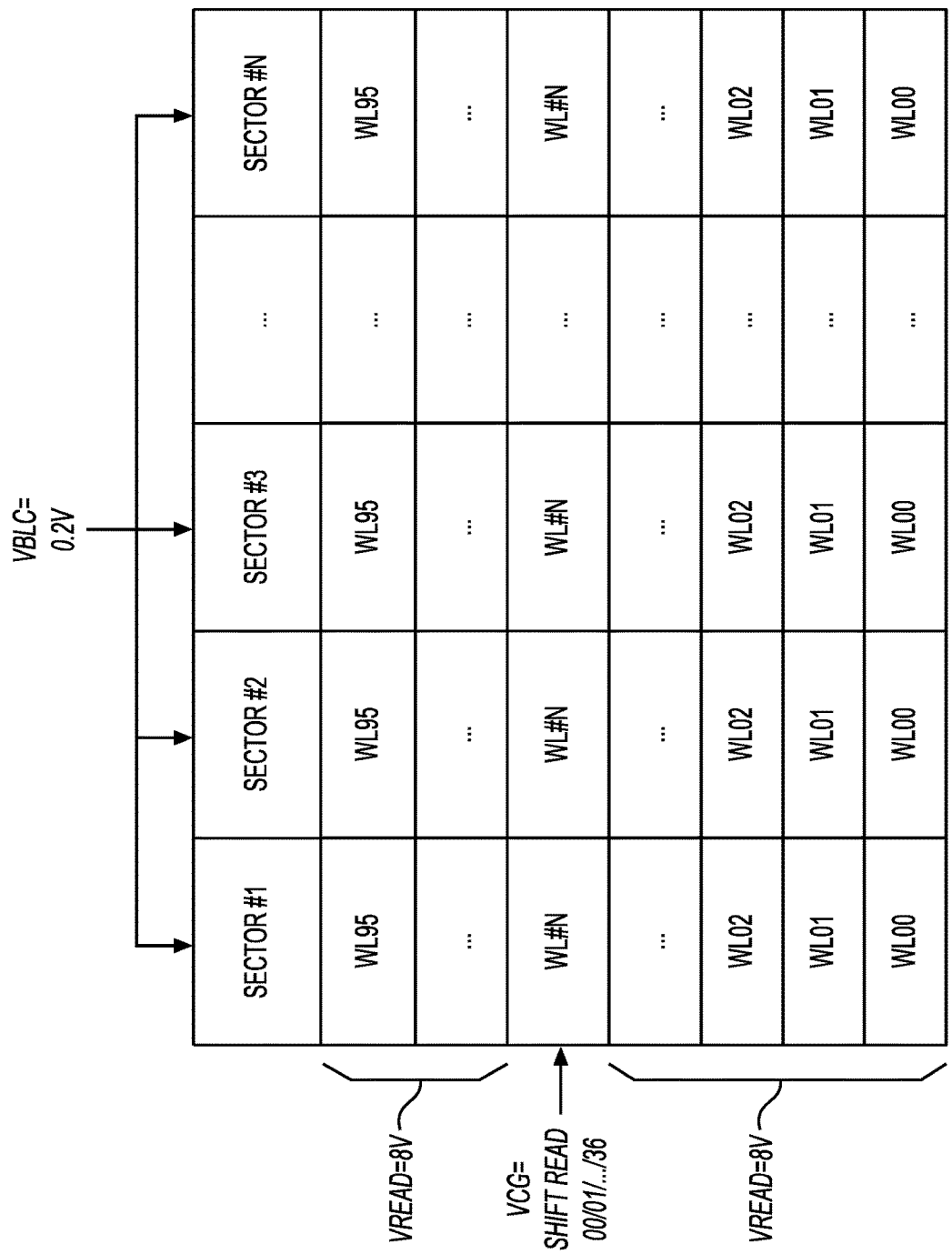
FIG. 11 shows a plurality of sectors of the non-volatile memory system while dynamically testing and adjusting a plurality of word line voltages and a plurality of bit line voltages according to aspects of the disclosure.
Figure 14:
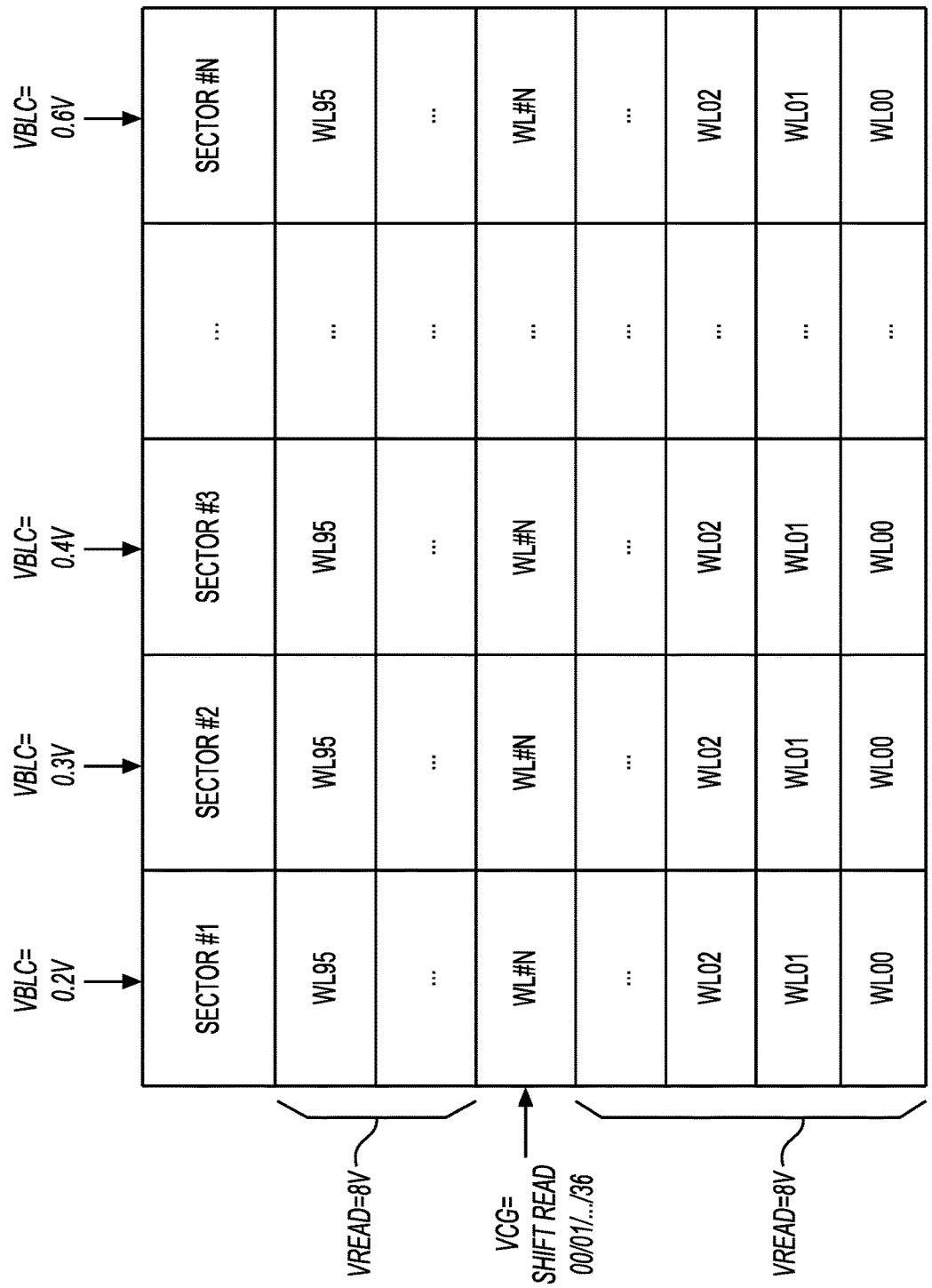
FIG. 14 shows the plurality of sectors of the non-volatile memory system while dynamically testing and adjusting the plurality of read parameters in parallel according to aspects of the disclosure.

FIG. 3B depicts an exemplary structure of memory cell array 126. In one embodiment, the array of memory cells is divided into M blocks of memory cells. The block is the unit of erase. That is, each block contains the minimum number of memory cells that are erased together. Each block is typically divided into a number of pages. A page is a unit of programming. One or more pages of data are typically stored in one row of memory cells. A page can store one or more sectors (FIGS. 11 and 14). A sector may include user data and overhead data. Overhead data typically includes parity bits of Error-Correcting Code that have been calculated from the user data of the sector. A portion of the controller calculates the Error-Correcting Code or ECC parity when data is being programmed into the array, and also checks it when data is being read from the array. Alternatively, the ECCs and/or other overhead data are stored in different pages, or even different blocks, than the user data to which they pertain.

FIG. 3B also shows more details of block i of memory array 126. Block i includes X+1 bit lines and X+1 NAND strings. Block i also includes a plurality of word lines (e.g., 64 data word lines WL0-WL63, 2 dummy word lines WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Memory cells on some of the NAND strings may be used for storing user data (both user data and ECCs and/or other overhead data), and memory cells on other NAND strings are used for storing memory system information. The memory cells that store used data may be referred to as user memory cells. Note that the user memory cells for a given word line may store what is commonly referred to as a codeword, which may comprise the user data and parity bits. The memory cells that store system data may be referred to as user memory cells. In one embodiment, the temperature codes are stored in system memory cells. Note that the temperature codes are not part of the codeword in such an embodiment. Hence, the temperature code can be read from the system memory cells without the need to read any of the user memory cells.

Each of the plurality of non-volatile memory cells 127 includes a control gate in communication with one of the plurality of word lines and a drain coupled to one of the plurality of bit lines. Again, each of the plurality of non-volatile memory cells 127 is configured to retain a threshold voltage within a common range of threshold voltages.

FIG. 4 depicts an example threshold voltage ($V_{TH}$) distribution for a two-bit per memory cell implementation. Generally, the set of multi-level memory cells 127 can be programmed to $2^n$ different states, where N≥2. For example, four, eight or sixteen states can be used. However, as the number of states increases and the spacing between states decreases, it is increasingly important to be able to accurately read back the programmed data state of each of the plurality of non-volatile memory cells 127. As mentioned at the outset, one factor which affects read accuracy is temperature, which can vary between the time the plurality of non-volatile memory cells 127 are programmed and read. Reading at a lower temperature than programming results in the $V_{TH}$ shifting higher. Similarly, reading at a higher temperature than programming results in the $V_{TH}$ shifting lower. For example, distributions 400, 402, 406 and 410 depict the E (erased), A, B and C states, respectively. Shifting of the $V_{TH}$ downward is depicted by threshold distributions 401, 404, 408 and 412 for the E, A, B and C states, respectively.

The control gate verify voltages $V_{V-A}$, $V_{V-B}$ and $V_{V-C}$ for states A, B and C, respectively, are used during the verify portion of a program-verify operation to verify whether one or more selected non-volatile memory cells 127 have been programmed to an intended state. Similarly, the control gate read voltages $V_{CGR-A}$, $V_{CGR-B}$ and $V_{CGR-C}$ for states A, B and C, respectively, are used during a read operation to ascertain the data state of one or more selected non-volatile memory cells 127. The threshold voltages can shift due to temperature and other effects to an extent which results in read errors. One approach to addressing temperature variations involves adjusting the control gate read voltages based on temperature. For example, if the $V_{TH}$ is raised, the control gate read voltage can be raised accordingly.

Figure 5:
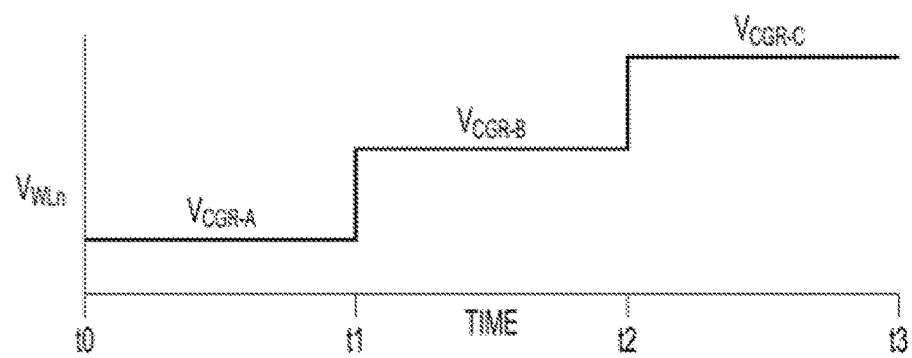
FIG. 5 depicts control gate read voltages applied to a selected word line during a read operation according to aspects of the disclosure.

FIG. 5 depicts control gate read voltages applied to a selected word line during a read operation. During a read operation, a control gate voltage waveform having successive amplitudes $V_{CGR-A}$, $V_{CGR-B}$ and $V_{CGR-C}$ for states A, B and C, respectively, is applied to the word line of one or more selected non-volatile memory cells 127 which are being read in time periods t0-t1, t1-t2 and t2-t3, respectively. This example applies to the case where there are four available data states. The plurality of word line voltages applied to each of the plurality of word lines during the reading correspond to a plurality of read levels. While only three amplitudes are shown ($V_{CGR-A}$, $V_{CGR-B}$ and $V_{CGR-C}$), it should be appreciated that any number of read levels may be utilized. According to an aspect, there are 36 read levels.

Figure 6:
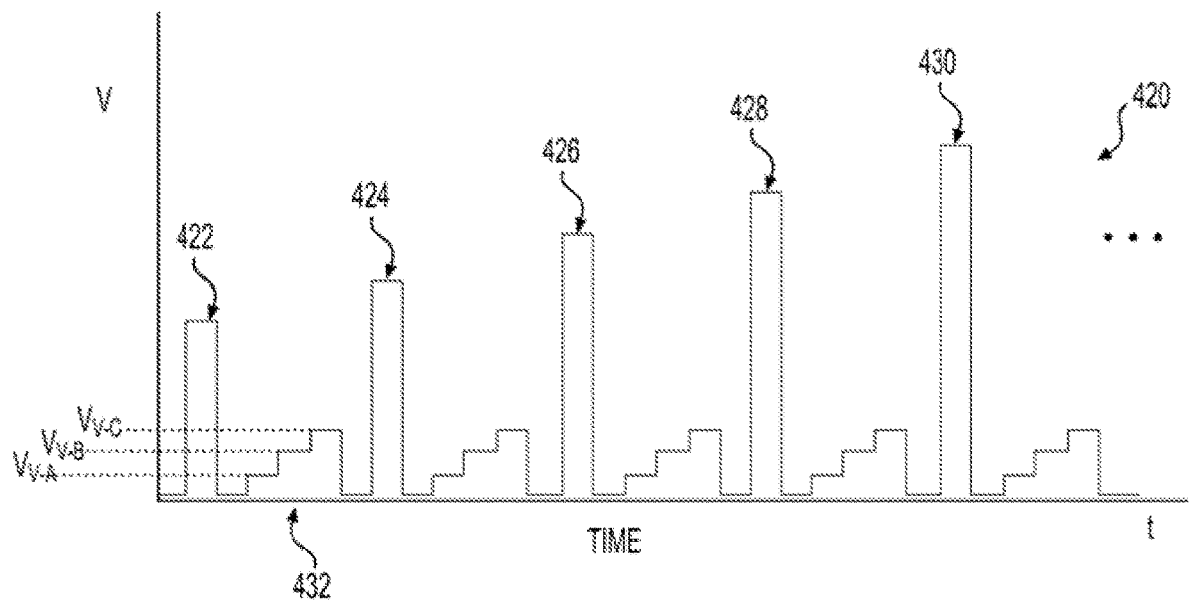
FIG. 6 depicts an example pulse train applied to the control gates of selected non-volatile memory cells during programming according to aspects of the disclosure.

FIG. 6 depicts an example pulse train applied to the control gates of selected non-volatile non-volatile memory cells 127 during programming. The pulse train 420 is used for programming and verifying non-volatile memory cells 127. The pulse train 420 includes a number of program pulses 422, 424, 426, 428, 430 . . . and a set of verify pulses (one example of which is verify pulse set 432) between each pair of program pulses for verifying the non-volatile memory cells 127. In one embodiment, the programming pulses have a voltage, VPGM, which starts at 12 V and increases by increments, e.g., 0.5 V, for each successive programming pulse until a maximum of, e.g., 20-25 V is reached. In some embodiments, there can be a verify pulse for each state that data is being programmed into, e.g., state A, B and C. In other embodiments, there can be more or fewer verify pulses. The verify pulses in each set can have amplitudes of $V_{V-A}$, $V_{V-B}$ and $V_{V-C}$, for instance.

FIG. 7 depicts a configuration of a NAND string 500 and components for sensing. In a simplified example, the NAND string 500 includes four memory cells 127 which are in communication with word lines WL0, WL1, WL2 and WL3, respectively. In practice, additional memory cells 127 and word lines can be used. Further, additional NAND strings are typically arranged adjacent to one another in a block, sector, or other set of non-volatile memory cells 127. The memory cells 127 are coupled to a p-well region of a substrate. The bit line 516 communicates with a drain side of the NAND string 500 and with the sense block 51, 52, 53. A bit line sense transistor 510 is coupled to the bit line 516. This is a high voltage transistor which is made conductive in response to a control 514 during sense operations to allow the sense block 51, 52, 53 to communicate with the NAND string 500.

A bit line voltage clamp (BLC) transistor 508 is a low voltage transistor which is opened in response to the control 514 to allow the bit line 516 to communicate with a sense amplifier (amp) 502. During a sense operation, such as a read or verify operation, a pre-charge operation occurs in which a capacitor (charge-storing component) 504 in the sense amp 502 is charged. The transistor 508 may be opened to allow the pre-charging. So, the sense modules 50, 51, 52 are each connected to one of the plurality of bit lines and include the bit line clamping transistor 508 for applying one of a plurality of bit line voltages (VBLC) to the one of the plurality of bit lines.

For example, assume the selected word line is WL1. During a sense operation, the voltage on WL1 is coupled to the control gates of the memory cells 127 on WL1. During a verify operation, after each program pulse, the sequence of verify voltages $V_{V-A}$, $V_{V-B}$ and $V_{V-C}$ is provided on WL1.

During a read operation, the sequence of read voltages $V_{CGR-A}$, $V_{CGR-B}$ and $V_{CGR-C}$ is provided on WL1. Further, a voltage $V_{SOURCE}$, typically at 0 V, is applied to the source side of the NAND string 500.

Also during the sense operation, when the word line voltage is applied, the transistor 510 is turned on, e.g., made conductive, at the drain side of the NAND string 500. Additionally, a voltage is applied to the transistor 508 to make it conductive. When the selected memory cell 127 is in a conductive state, the pre-charged capacitor 504 discharges through the bit line and into the source, via the memory cell 127 and NAND string, so that the source acts as a current sink. A current "I" flows as indicated.

A pull down circuit 512 pulls the bit line to ground, $V_{SOURCE}$ or other level once sensing is completed for a memory cell 127, so that the memory cell 127 is locked out from further sensing, even as sensing continues for other memory cells 127 on other NAND strings.

Figure 8A:
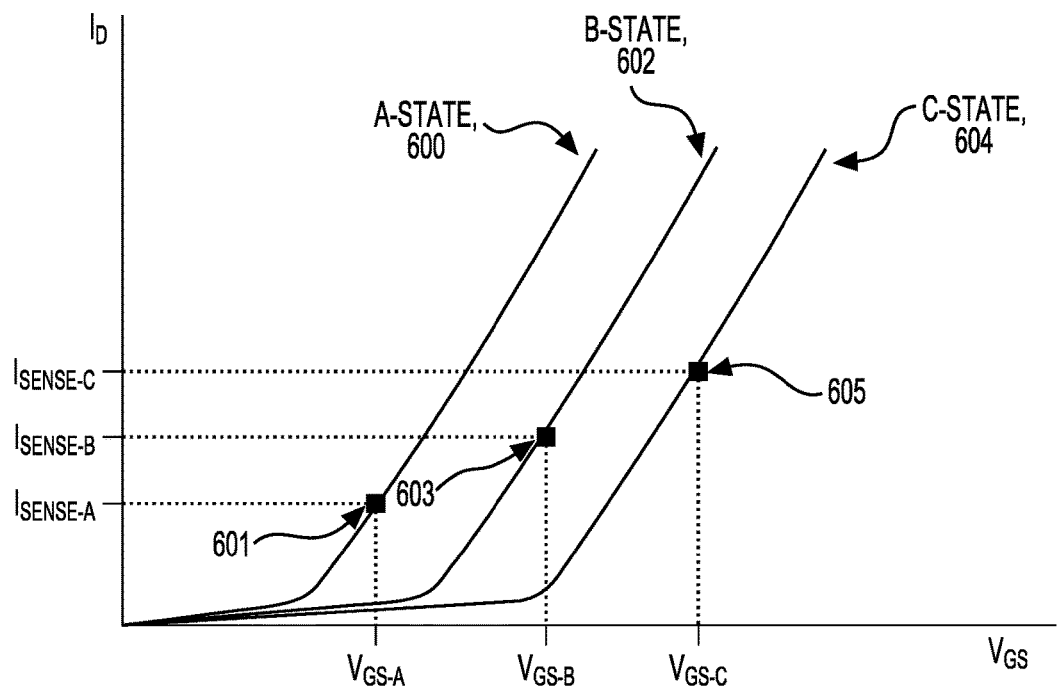
FIG. 8A depicts a current versus gate-to-source voltage relationship for the memory cell for different states according to aspects of the disclosure.

FIG. 8A depicts a current versus gate-to-source voltage relationship for a memory cell 127 for different states. The x-axis depicts the gate-to-source voltage of a memory cell 127 which is being sensed. For example, gate-to-source voltages of $V_{GS-A}$, $V_{GS-B}$ and $V_{GS-C}$ are indicated. During a verify operation, with $V_{SOURCE}=0$ V, of $V_{GS-A}$, $V_{GS-B}$ and $V_{GS-C}$ are the same as $V_{V-A}$, $V_{V-B}$ and $V_{V-C}$, respectively. During a read operation, with $V_{SOURCE}=0$ V, of $V_{GS-A}$, $V_{GS-B}$ and $V_{GS-C}$ are the same as $V_{CGR-A}$, $V_{CGR-B}$ and $V_{CGR-C}$, respectively. The y-axis depicts the drain current $I_D$, which is the current passing through the memory cell 127 and the NAND string 500. This is also referred to as the sense current because it is the current which occurs during sensing. The reference sense current levels $I_{SENSE-A}$, $I_{SENSE-B}$ or $I_{SENSE-C}$, are also depicted. As mentioned, the sensing process can be configured so that, during program-verify, a memory cell 127 is not considered to be programmed to a given state until a current flows which falls below the reference sense current for that state. In contrast, during a read operation, a memory cell 127 is locked out from further sensing when a current flows which exceeds the reference sense current.

Curves 600, 602 and 604 depict the current to voltage relationship for memory cells 127 in the A, B and C states, respectively. Generally, a current begins to flow from the drain to the source of a memory cell 127 when $V_{GS}$ begins to exceed the threshold voltage of the memory cell 127. This level of $V_{GS}$ will vary for the different states since the threshold voltage varies for the different states. A weak current occurs for low values of $V_{GS}$ and the current increases for higher values of $V_{GS}$, at which point the memory cell 127 is considered to be in a conductive state. That is, the memory cell 127 is generally considered to be in a conductive state when it is at an operating point at which the curve has turned up sharply at a knee in the curve. Based on $V_{GS}$, a corresponding sense current will flow. For example, operating points 601, 603 and 605 may be identified at which the increasingly higher sense currents are $I_{SENSE-A}$, $I_{SENSE-B}$, and $I_{SENSE-C}$, respectively. The detected current must fall below these levels in order for a memory cell 127 to be fully programmed.

For example, during programming to the C state for instance, the current which flows during a verify operation will be large, initially, since $V_{V-A}(=V_{GS})>V_{TH}$ is large (since $V_{V-A}$ is fixed, $V_{SOURCE}$ is 0 V and $V_{TH}$ is initially small). As additional program pulses are applied, $V_{TH}$ will become larger so that $V_{GS}-V_{TH}$ becomes smaller and current also becomes smaller. Eventually, the current falls below the reference level, at which point the memory cell 127 is fully programmed.

Figure 8B:
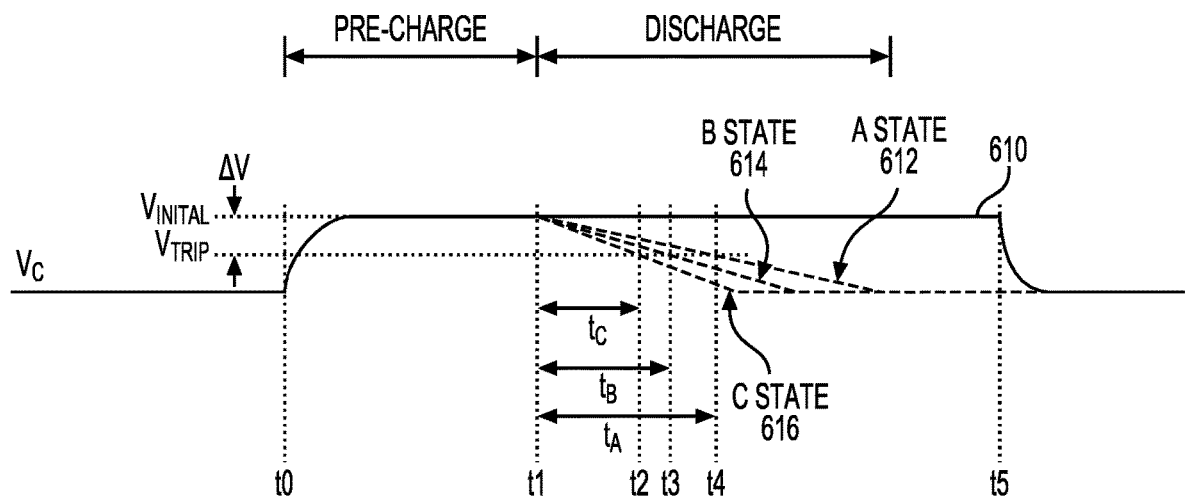
FIG. 8B depicts discharging of a voltage on a sense capacitor for different states according to aspects of the disclosure.

FIG. 8B depicts discharging of a voltage on the sense capacitor 504 for different states. During a sensing operation, the voltage on the capacitor 504 (FIG. 7) is pre-charged to an initial voltage $V_C=V_{INITIAL}$ in a pre-charge phase between t0 and t1. The pre-charging also brings the bit line voltage to a predetermined level which is appropriate for sensing. At a specified time t1, with the control gate voltage applied to the selected word line, a discharge phase begins in which the capacitor 504 discharges into the selected memory cell 127 via the NAND string 500, and sinks to the source, if the selected memory cell 127 is in a conductive state. Further, the rate of discharge can vary depending on the state as indicated by lines 612, 614, and 616 for the A, B and C states, respectively. If the selected memory cell 127 is not in a conductive state, the capacitor 504 will not significantly discharge, as indicated by line 610. By setting a sense time, also referred to as an integration time or discharge time, based on the data state, a corresponding sense current is induced. In particular, a sense time of $t_A=t4-t1$, $t_B=t3-t1$ or $t_C=t2-t1$ can be used for the A, B or C state, respectively. The sense time can also be adjusted as discussed in more detail below.

As discussed previously, a method known as "Dynamic Read" can be used to help compensate for significant temperature cross by applying a set of different word line biases or word line voltages based on temperature according to a table. FIG. 10 depicts an example 700 of an implementation of the "Dynamic Read" that may be used in the non-volatile memory system 100 of FIG. 1. An adjusted read voltage, for example the one of a plurality of word line voltages, may be generated by or based on a sum of a default value of the read voltage 701 and an offset retrieved from an offset table 702. The offset table 702 may, for example, be stored in the ROM 122a of FIG. 1. The offset table 702 includes multiple columns, each column corresponding to a respective read temperature range. The offset table 702 also includes a number of rows, each row corresponding to a respective write temperature range.

An example of temperature ranges that may be used as the read temperature ranges and the write temperature ranges is depicted in a range table 704. For example, range 0 may span from a temperature of -25 degrees (e.g., degrees Celsius) to a temperature of 0 degrees. Range 1 may correspond to a temperature in the range from one degree to 25 degrees. Range 2 may correspond to a temperature between 26 and 50 degrees. Range 3 may correspond to a temperature from 51 degrees to 75 degrees. Range 4 may correspond to a temperature from 76 degrees to 100 degrees.

As illustrated, the offset table 702 omits values for entries that correspond to matching temperature ranges and read temperature ranges. For example, an entry of the offset table 702 corresponding to a read temperature in range 1 and a write temperature in range 1 includes a value "N/A", meaning that the entry may be omitted from the table, may be empty of data, or may include zero values (e.g., zero offset to the default value 701). Other entries of the offset table 702 include offset values that may be negative values or may be positive values. When the read temperature range corresponds to a lower temperature range than the write temperature range, the offset stored in the table entries may have negative values, such as Offset_Neg_1. Similarly, for table entries where the write temperature range exceeds the read temperature range, values in the table entries may be positive, such as Offset_Pos_1.

As illustrated, for five temperature ranges, a total of four negative offset values and four positive offset values may be used. Thus, a reduced amount of data may be used to adjust for differences in read temperature ranges using a relatively small amount of offset data as compared to including a distinct offset value for each temperature difference. Although the offset table 702 is illustrated as having a table format, in other implementations the values of Offset_Pos_1-4 and Offset_Neg_1-4 may be stored in a data structure having a non-table format and may be selectively accessed based on differences between the read temperature range and the write temperature range.

Figures 10A, 10B:
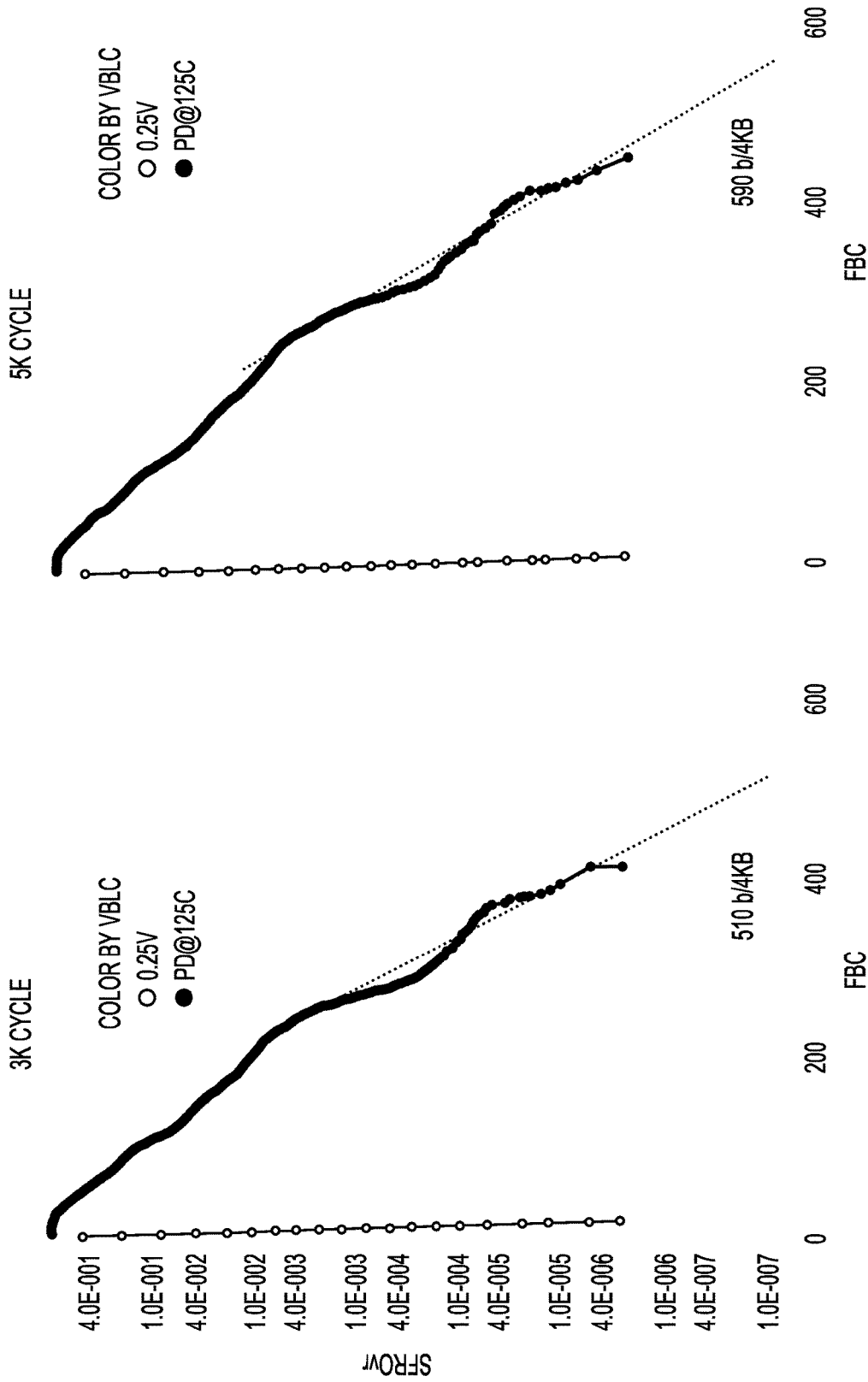
FIGS. 10A and 10B show failure bit counts for dynamic reading of an example memory device after 3000 cycles and after 5000 cycles according to aspects of the disclosure.

However, such a dynamic read method using a table (e.g., offset table 702) typically only applies different word lines biases or voltages. If the chain or sting 500 of memory cells 127 is cut off (i.e., will not conduct current) due to low channel current, this method alone is not completely effective. In addition, the dynamic read table (e.g., offset table 702) may not effectively compensate die-to-die temperature cross variation due to the large dynamic table necessary to cover all possibilities and may still fail after using ECC, leading to uncorrectable errors. FIGS. 10A and 10B show failure bit counts for dynamic reading of an example memory device after 3000 cycles (FIG. 10A) and after 5000 cycles (FIG. 10B).

Such failure bit counts can be significantly improved by dynamically compensating the channel current and die-to-die subthreshold slope/cross temperature coefficient. As discussed, the control circuit 110 is in communication with the plurality of non-volatile memory cells 127 and the plurality of word lines and the plurality bit lines. So, the control circuit 110 is configured to read the threshold voltage $V_{TH}$ of each of the plurality of non-volatile memory cells 127 using a plurality of read parameters. Specifically, the plurality of read parameters includes a plurality of bit line voltages in addition to a plurality of word line voltages. Initially, the plurality of read parameters can be a plurality of default read parameters (i.e., a default read). Then, the control circuit 110 determines whether reading the plurality of non-volatile memory cells 127 using the plurality of default read parameters is successful. Because the control circuit 110 includes an error-correction code engine 224 (e.g., as part of controller 122) configured to detect and correct read errors of the plurality of non-volatile memory cells 127, the determination of a successful read can be done using the error-correction code engine 224.

In response to determining that reading the plurality of non-volatile memory cells 127 using the plurality of default read parameters is not successful, the control circuit 110 then dynamically tests and adjusts the plurality of read parameters based on whether reading the plurality of non-volatile memory cells 127 using the plurality of read parameters is successful until the plurality of read parameters is determined to result in a successful read (or a read failure is identified). In other words, optimal read parameters are determined through positive feedback. Again, the control circuit 110 can determine whether the reading of the threshold voltage $V_{TH}$ of each of the plurality of non-volatile memory cells 127 is successful using the error-correction code engine 224.

As discussed, the control circuit 110 includes a temperature-sensing circuit 115 for sensing a present temperature of the memory system 100. Accordingly, the control circuit 110 can configured to determine the present temperature of the non-volatile memory system 100 using the temperature-sensing circuit 115. The control circuit 110 can then dynamically test and adjust the plurality of read parameters based on the present temperature of the apparatus. However, it should be understood that the control circuit 110 may determine whether to dynamically test and adjust the plurality of read parameters based on whether the reading the plurality of non-volatile memory cells 127 using the plurality of default read parameters is successful, irrespective of the present temperature.

In addition, referring back to FIG. 9, the offset table 702 can include the plurality of offsets (e.g., Offset_Pos_1) based on the present temperature for the plurality of word line voltages. Thus, the control circuit 110 is further configured to perform a conventional "Dynamic Read" of the threshold voltage of each of the plurality of non-volatile memory cells 127 using the plurality of word line voltages adjusted using the offset table 702 in response to determining that reading the plurality of non-volatile memory cells 127 using the plurality of default read parameters is not successful. So, the conventional "Dynamic Read" utilizes the plurality of word line voltages adjusted using the offset table 702, instead of default word line voltages. The control circuit 110 then can determine whether performing the conventional "Dynamic Read" of the plurality of non-volatile memory cells 127 using the plurality of word line voltages adjusted using the offset table 702 is successful.

Referring to FIGS. 11, 12, 13A-13F and according to an aspect, the control circuit 110 is configured to perform a series of steps in response to determining that performing the conventional "Dynamic Read" of the plurality of non-volatile memory cells 127 using the plurality of word line voltages adjusted using the offset table 702 is not successful. First, the control circuit 110 is configured to 1) apply one of the plurality of bit line voltages to the plurality of bit lines coupled to the plurality of non-volatile memory cells 127 of all of the plurality of sectors (e.g., 0.2 V as shown in FIG. 11). The plurality of sectors (e.g., Sector #1, Sector #2, etc.) are shown in FIG. 11. Next, the control circuit 110 is configured to 2) apply one of the plurality of word line voltages to each of the plurality of word lines coupled to each selected one of the plurality of non-volatile memory cells 127 while applying a pass voltage $V_{read}$ to each of the plurality of word lines coupled to each nonselected others of the plurality of non-volatile memory cells 127 of the all of the plurality of sectors. The control circuit 110 is then configured to 3) determine whether reading the plurality of non-volatile memory cells 127 using the one of the plurality of bit line voltages and the one of the plurality of word line voltages is successful. The control circuit 110 proceeds to 4) increment the one of the plurality of word line voltages in response to determining that reading the plurality of non-volatile memory cells 127 using the one of the plurality of bit line voltages and the one of the plurality of word line voltages is not successful. Then, the control circuit 110 is configured to 5) store the one of a plurality of bit line voltages and the one of the plurality of word line voltages in response to determining that reading the plurality of non-volatile memory cells 127 using the one of the plurality of bit line voltages and the one of the plurality of word line voltages is successful. The control circuit 110 is further configured to 6) iteratively perform steps 1-5 for all of the plurality of word line voltages (e.g., for each of the plurality of read levels 1-36).

Next, the control circuit 110 is configured to 7) increment the one of the plurality of bit line voltages (e.g., increment by 50 millivolts) and return to step 1 in response to determining that reading the plurality of non-volatile memory cells 127 using the one of the plurality of bit line voltages and all of the plurality of word line voltages is not successful. The control circuit 110 is then configured to 8) iteratively perform steps 1-7 for all of the plurality of bit line voltages (e.g., 0.2 V, 0.3 V, 0.4 V, 0.5 V, and 0.6 V). The control circuit 110 proceeds to 9) use the one of a plurality of bit line voltages and the one of the plurality of word line voltages for reading in response to determining that reading the plurality of non-volatile memory cells 127 using the one of the plurality of bit line voltages and the one of the plurality of word line voltages is successful. Finally, the control circuit 110 is configured to 10) report a read failure in response to determining that reading the plurality of non-volatile memory cells 127 using all of the plurality of bit line voltages and all of the plurality of word line voltages is not successful.

Figure 12:
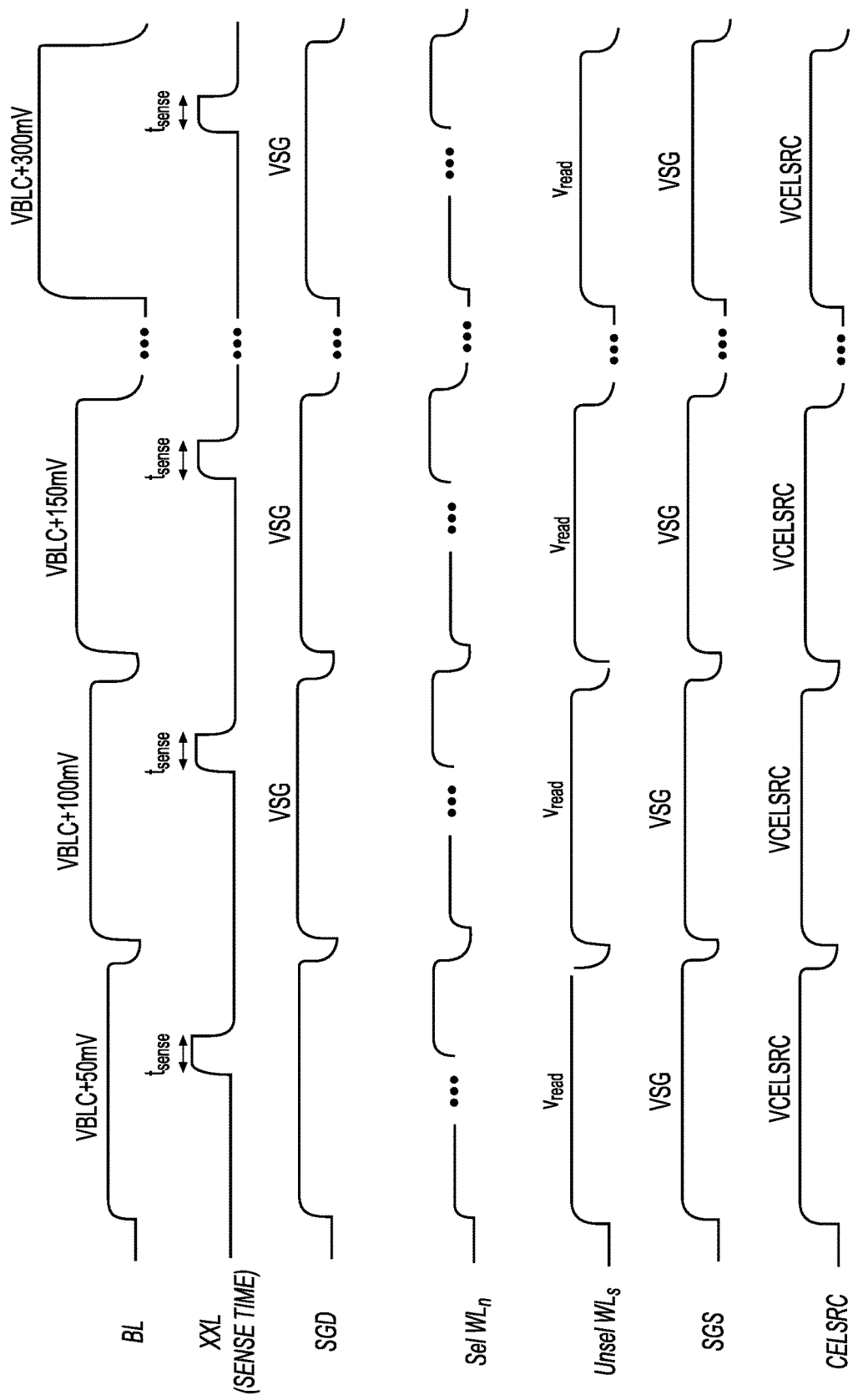
FIG. 12 illustrates waveforms associated with operations by the control circuit when dynamically testing and adjusting the plurality of word line voltages and the plurality of bit line voltages of the plurality of sectors of FIG. 11 according to aspects of the disclosure.
Figures 13A, 13B, 13C, 13D:
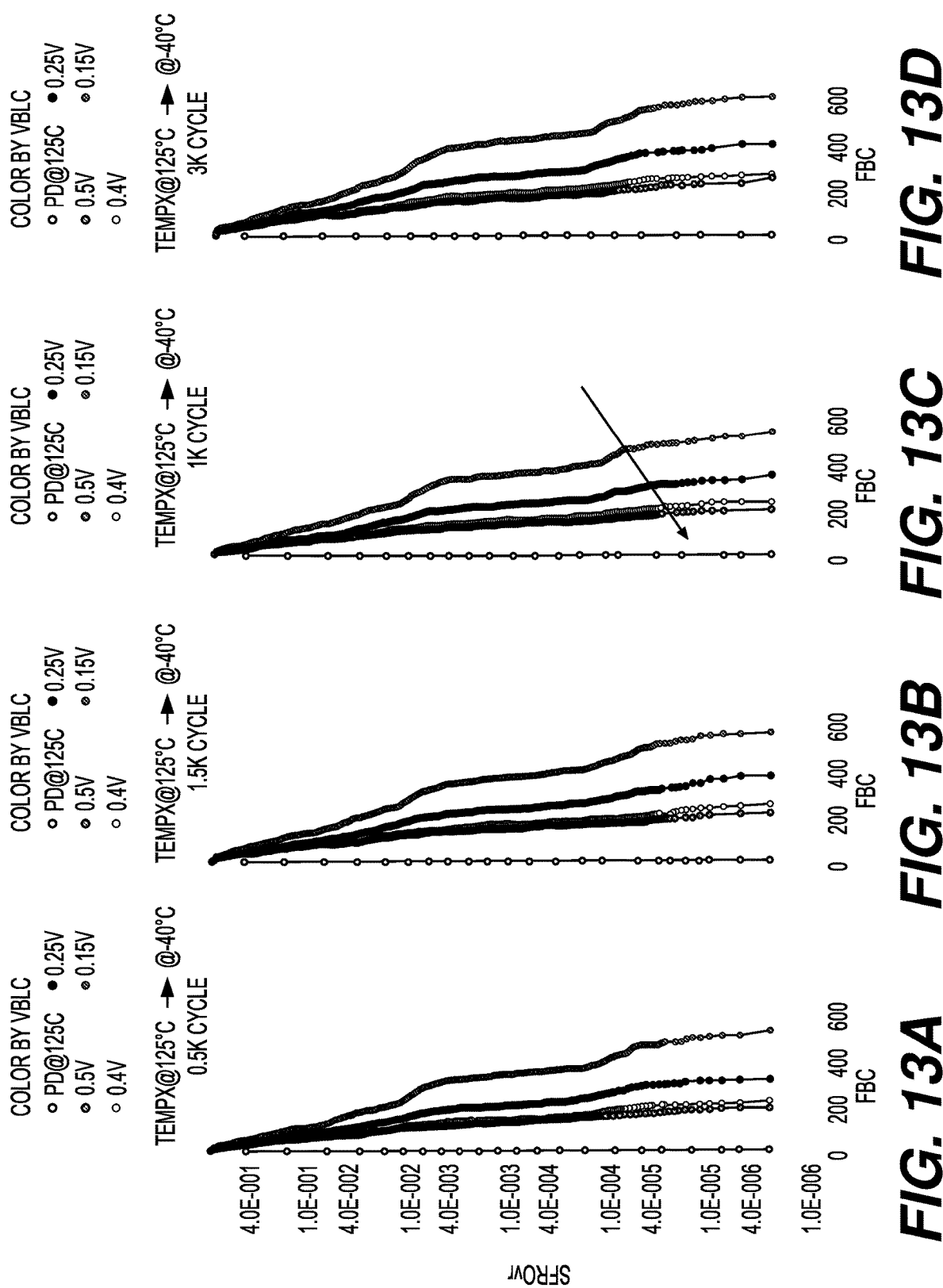

So, in summary, reading/sensing according to the algorithm in steps 1-10 is carried out by the control circuit 110 sequentially by different bit line voltages. A unified bit line voltage is used in all sectors, so that in one unit time, only one read level under one bit line voltage is attempted. Another bit line voltage is attempted only when all of plurality of read levels under the previous bit line voltage is determined to be unsuccessful. FIG. 12 illustrates waveforms associated with operations by the control circuit 110 when the conventional "Dynamic Read" of the plurality of non-volatile memory cells 127 using the plurality of word line voltages adjusted using the offset table 702 is not successful and the control circuit 110 carries out steps 1-10.

FIGS. 13A-13F show a series of probability vs. failure bit count graphs for multiple sets of cycles of the memory system 100 using example bit line voltages. Specifically, a read operation of the example memory system 100 is performed at −40 degrees Celsius after it is programmed at 125 degrees Celsius. As shown, the higher bit line voltage results in an improved sector failure rate. Thus, the algorithm carried out by the control circuit 110 in steps 1-10 above adequately enhances the channel current of the "outlier" dies without altering the majority dies, resulting in a significant improvement of the overall bit error rate ~30%. However, if for example, the quantity of the plurality of bit line voltages is M and the quantity of the plurality of read levels is N, O(M×N) time complexity may be needed to obtain the correct data in a worst case scenario.

Thus, according to another aspect and shown in FIG. 14, a parallel searching algorithm which can effectively reduce the searching time to approximately O(N) is provided. In more detail, the control circuit 110 is configured to perform the following steps in response to determining that performing the conventional "Dynamic Read" of the plurality of non-volatile memory cells 127 using the plurality of word line voltages adjusted using the offset table 702 is not successful. First, the control circuit 110 is configured to 1) set a dynamic read flag to zero (indicating that the best plurality of read parameters, e.g., bit line voltage and word line voltage has not yet been identified) and 2) apply one of the plurality of bit line voltages to the plurality of bit lines coupled to the plurality of non-volatile memory cells 127 of one of the plurality of sectors (the plurality of sectors, Sector #1, Sector #2, etc. are shown in FIG. 14). Next, the control circuit 110 is configured to 3) increment the one of the plurality of bit line voltages to a successive one of the plurality of bit line voltages and apply the successive one of the plurality of bit line voltages to a successive one of the plurality of sectors. The control circuit 110 is next configured to 4) iteratively repeat step 3 for all of the plurality of sectors.

The control circuit 110 proceeds to 5) apply one of the plurality of word line voltages to each of the plurality of word lines coupled to each selected one of the plurality of non-volatile memory cells 127 while applying a pass voltage $V_{read}$ to each of the plurality of word lines coupled to each nonselected others of the plurality of non-volatile memory cells 127 of the all of the plurality of sectors. Then, the control circuit 110 is configured to 6) determine whether reading the plurality of non-volatile memory cells 127 using the plurality of bit line voltages and the one of the plurality of word line voltages is successful individually for each of the plurality of sectors. The next step carried out by the control circuit 110 is to 7) increment the one of the plurality of word line voltages in response to determining that reading the plurality of non-volatile memory cells 127 using the one of the plurality of bit line voltages and the one of the plurality of word line voltages is not successful. The control circuit 110 is then configured to 8) store one of the plurality of bit line voltages and the one of the plurality of word line voltages and set the dynamic read flag to one in response to determining that reading the plurality of non-volatile memory cells 127 using the one of the plurality of bit line voltages and the one of the plurality of word line voltages is successful. The control circuit 110 is also configured to 9) iteratively perform steps 1-8 for all of the plurality of word line voltages.

Next, the control circuit 110 is configured to 10) use the one of a plurality of bit line voltages and the one of the plurality of word line voltages for reading in response to determining that reading the plurality of non-volatile memory cells 127 using the one of the plurality of bit line voltages and the one of the plurality of word line voltages is successful. Finally, the control circuit 110 proceeds to 11) report a read failure in response to determining that reading the plurality of non-volatile memory cells 127 using all of the plurality of bit line voltages and all of the plurality of word line voltages is not successful.

Thus, different ones of the plurality of bit line voltages are sensed in parallel using different bit line voltages in different sectors in steps 1-11 above. Data integrity is checked on each sector individually. In one unit time, one read level under all of the plurality of bit line voltages are performed (all bit line voltages are triggered concurrently). For example, the control circuit 110 applies a bit line voltage of 0.2 V (default) in a first sector, 0.3 V in a second sector, and 0.6 V in an Nth sector and different read levels (1-36) are sequentially tried on the word lines of all sectors. When a sector passes (meaning any fail bits can be corrected by the ECC engine 224), the dynamic read flag is set to one (indicating that the best plurality of read parameters, e.g., bit line voltage and word line voltage has been identified) and then these read parameters are used on all sectors.

Figure 15:
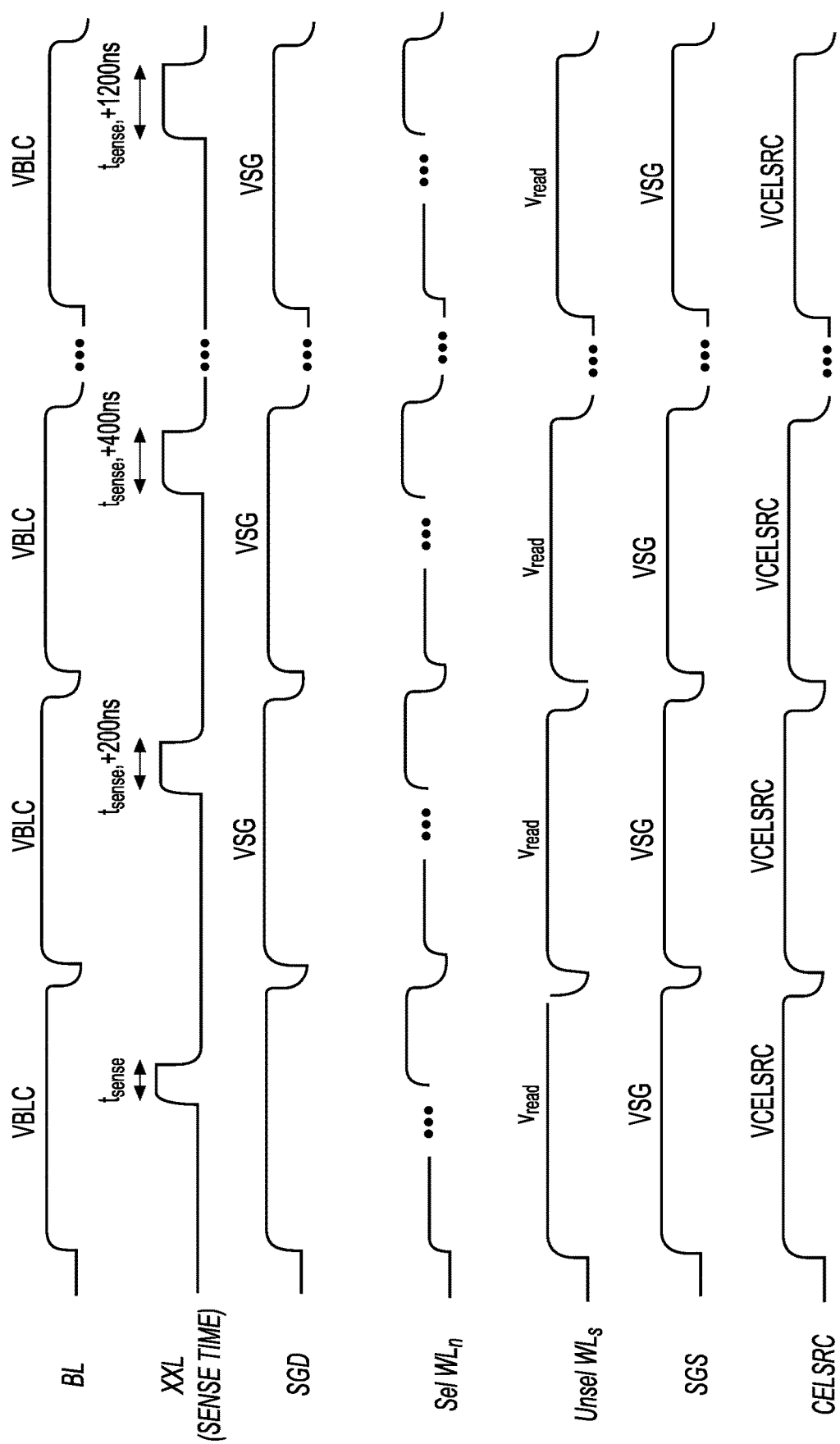
FIG. 15 illustrates waveforms associated with operations by the control circuit when dynamically testing and adjusting a plurality of sense times of the plurality of sectors of FIG. 14 according to aspects of the disclosure.
Figure 16:
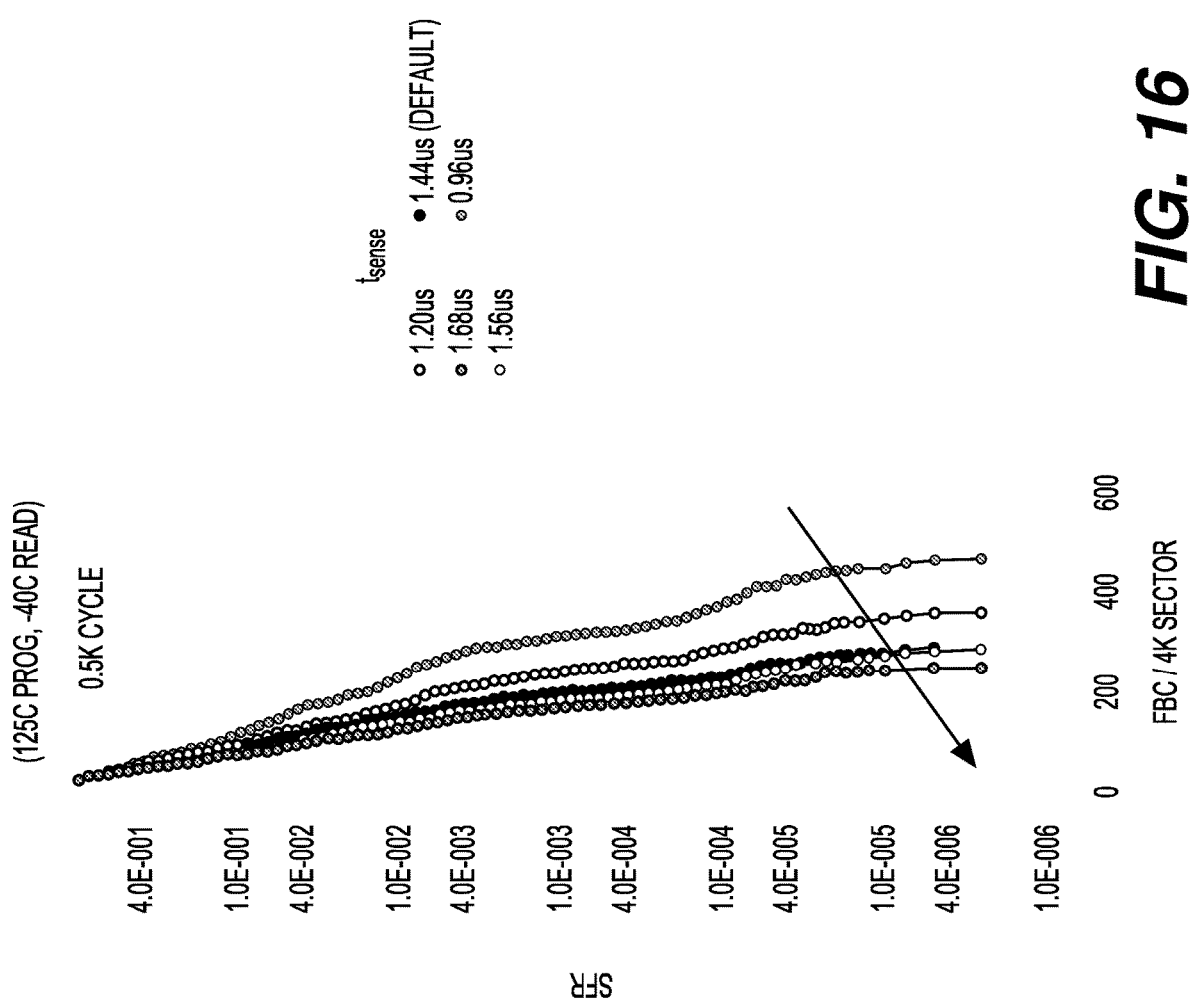
FIG. 16 shows another probability vs. failure bit count graph for the plurality of sense times used for the non-volatile memory system according to aspects of the disclosure.

Now referring to FIGS. 15 and 16 and according to another aspect, the control circuit 110 can also dynamically test and adjust other read parameters, such as the sense time (FIG. 8B). Thus, the control circuit 110 is configured to perform the following steps in response to determining that performing the conventional "Dynamic Read" of the plurality of non-volatile memory cells 127 using the plurality of word line voltages adjusted using the offset table 702 is not successful. First, the control circuit 110 is configured to 1) apply the bit line voltage to the plurality of bit lines coupled to the plurality of non-volatile memory cells 127 of each of the plurality of sectors. Next, the control circuit 110 is configured to 2) apply the word line voltage to each of the plurality of word lines coupled to each selected one of the plurality of non-volatile memory cells 127 while applying a pass voltage $V_{read}$ to each of the plurality of word lines coupled to each nonselected others of the plurality of non-volatile memory cells 127 of the each of the plurality of sectors. Then, the control circuit 110 proceeds to 3) sense the bit line current in a string of one of the plurality of sectors associated with the selected one of the plurality of non-volatile memory cells 127 for one of the plurality of sense times. The control circuit 110 is next configured to 4) determine whether reading the plurality of non-volatile memory cells 127 using the one of the plurality of sense times is successful. The control circuit 110 is also configured to 5) store the one of the plurality of sense times in response to determining that reading the plurality of non-volatile memory cells 127 using the one of the plurality of sense times is successful. Next, the control circuit 110 is configured to 6) increment the one of the plurality of sense times (e.g., by 200 nanoseconds) in response to determining that reading the plurality of non-volatile memory cells 127 using the one of the plurality of sense times is not successful. The control circuit 110 is additionally configured to 7) iteratively perform steps 1-6 for all of the plurality of sense times.

The control circuit 110 then is configured to 8) use the one of the plurality of sense times for reading in response to determining that reading the plurality of non-volatile memory cells 127 using the one of the plurality of sense times is successful. Finally, the control circuit 110 is configured to 9) report a read failure in response to determining that reading the plurality of non-volatile memory cells 127 using all of the plurality of sense times is not successful. FIG. 16 shows experimental results using steps 1-9. So, the read algorithm carried out of the control circuit 110 in steps 1-9 is also efficient in improving overall bit error rate; however, this method solely shifts the sensing level for channel current without actually increasing the channel current in the NAND chain 500, thus not altering the majority dies.

Figure 17:
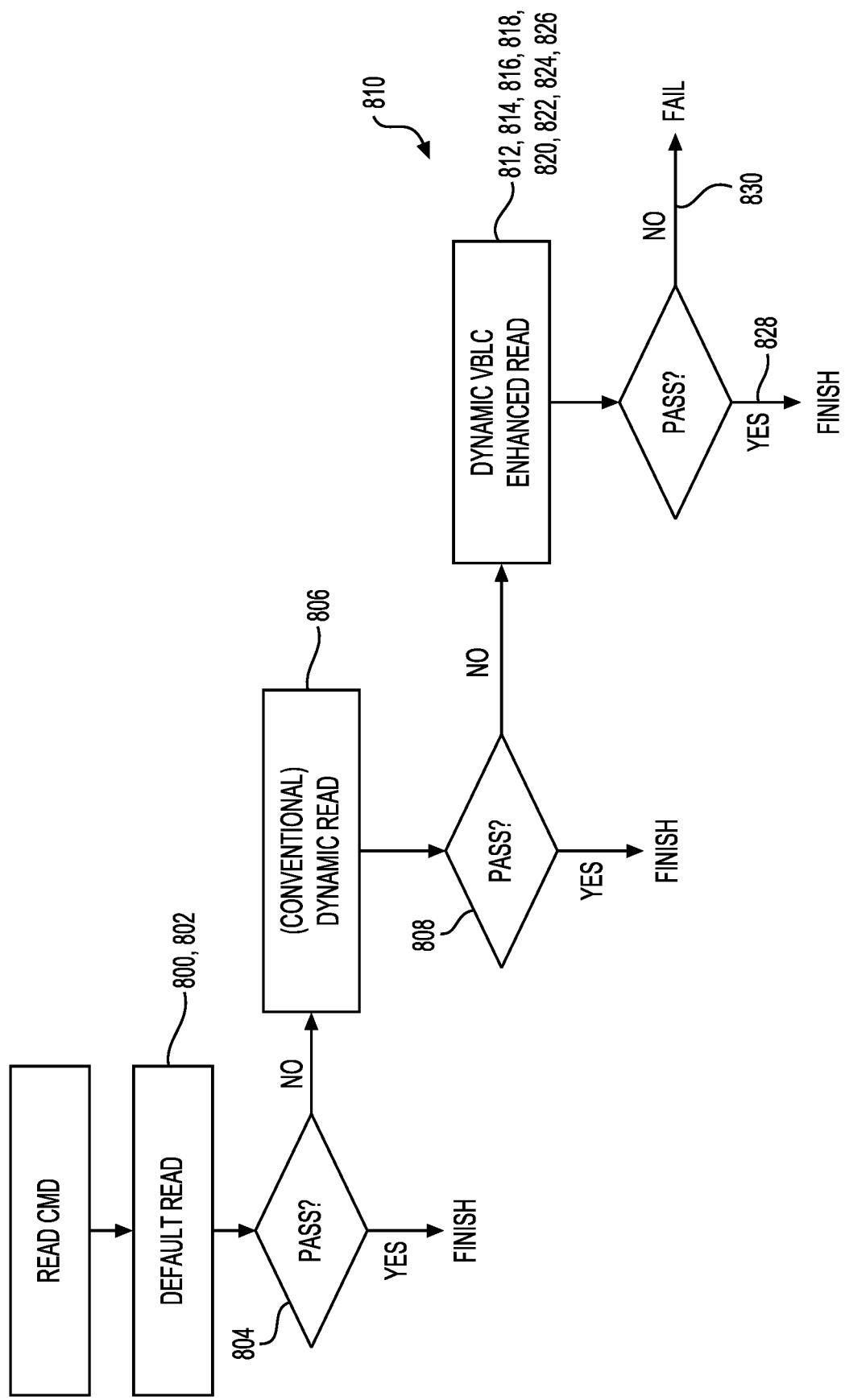
FIGS. 17-19 illustrate steps of a method of operating a non-volatile memory system according to aspects of the disclosure.
Figure 18:
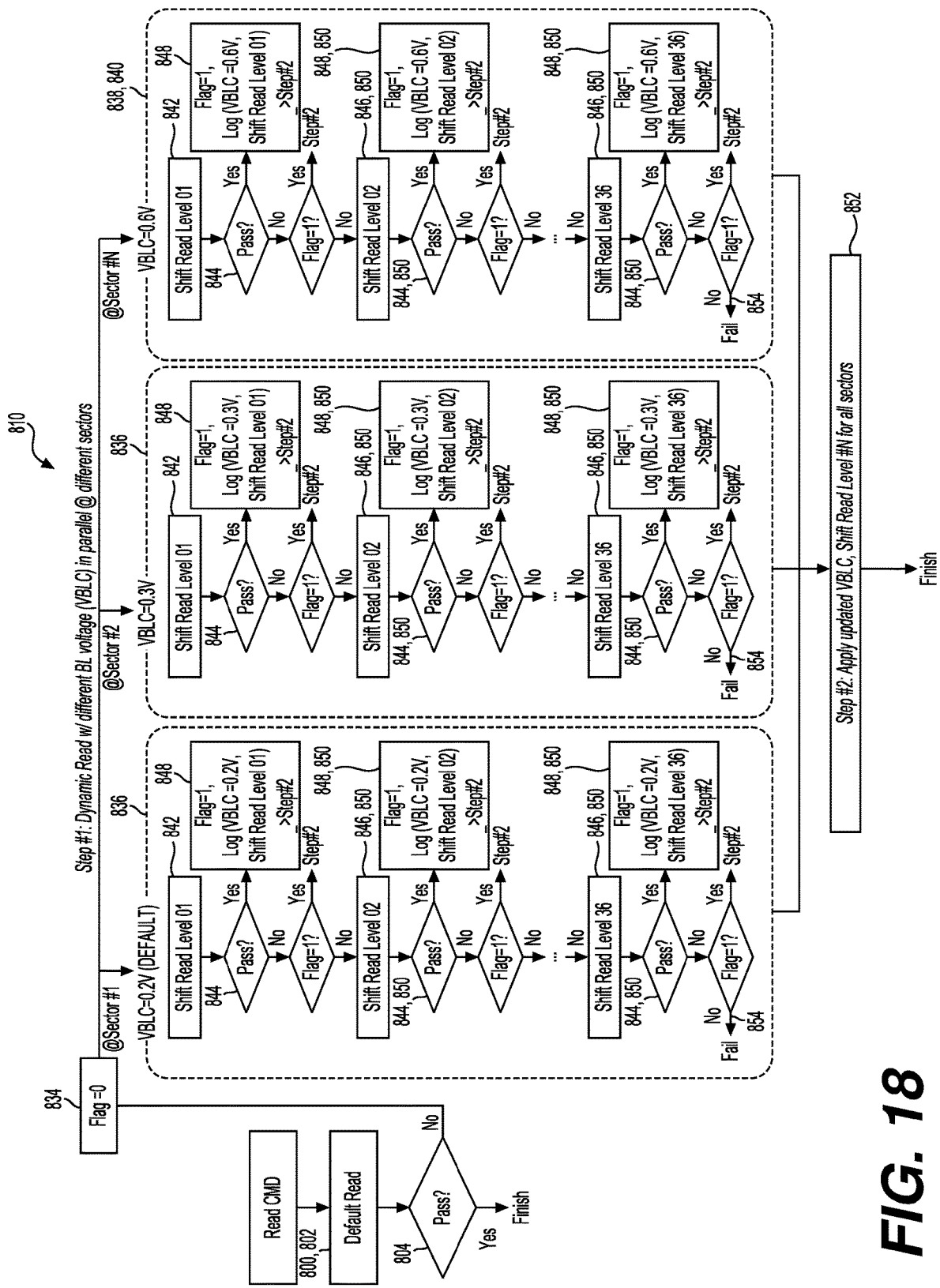
Figure 19:
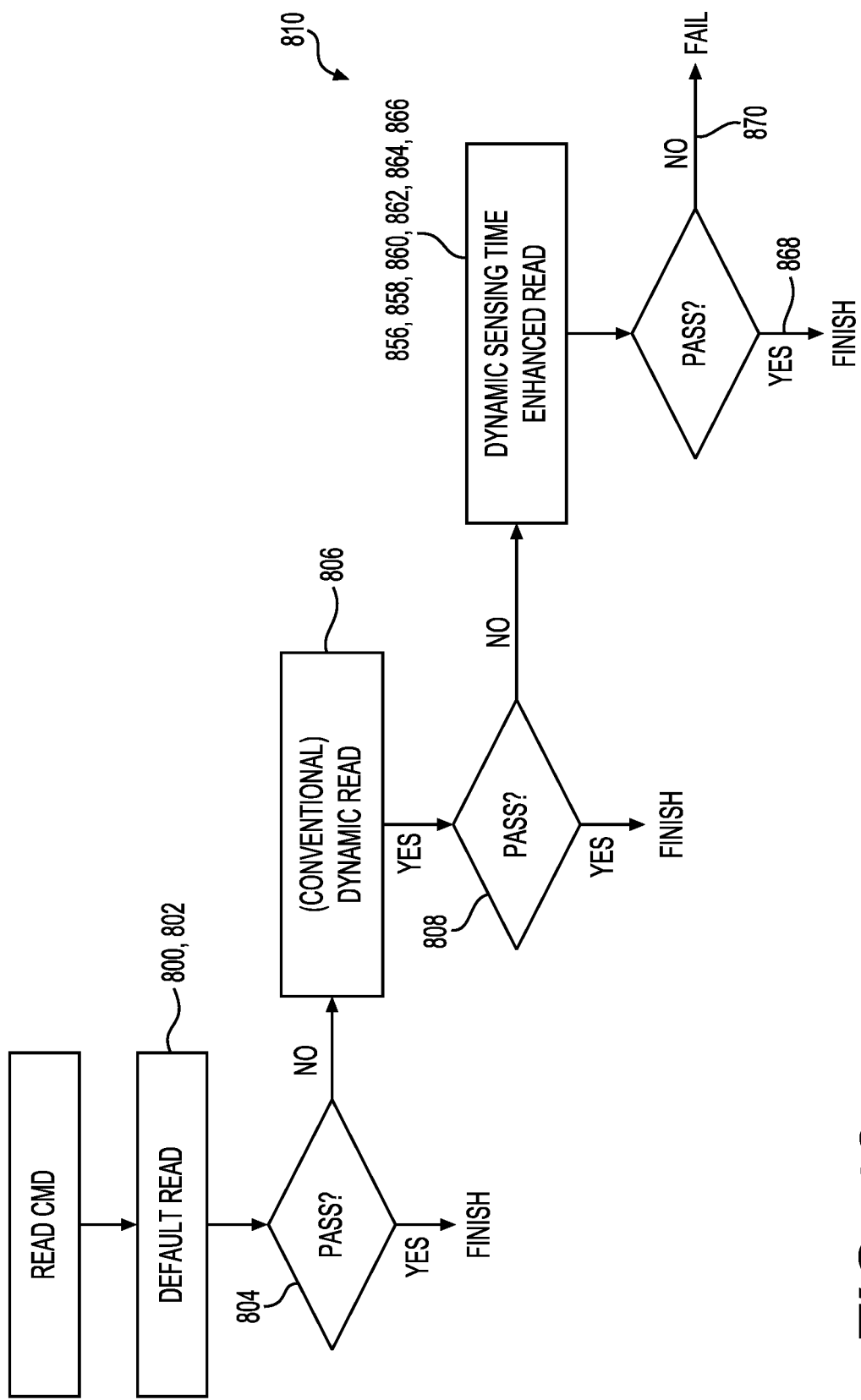

As best shown in FIGS. 17-19, a method of operating the non-volatile memory system 100 is also provided. The method includes the step of 800 providing the non-volatile memory system 100 with a plurality of non-volatile memory cells 127 arranged in a plurality of sectors each comprising at least one string. Each of the plurality of non-volatile memory cells 127 includes a control gate in communication with one of a plurality of word lines (e.g., WL1, WL1 of FIG. 7) and a drain coupled to one of a plurality of bit lines (e.g., bit line 516 of FIG. 7) and each configured to retain a threshold voltage within a common range of threshold voltages. The method continues with the step of 802 reading the threshold voltage of each of the plurality of non-volatile memory cells 127 using a plurality of read parameters being a plurality of default read parameters.

The next step of the method is 804 determining whether reading the plurality of non-volatile memory cells 127 using the plurality of default read parameters is successful. As discussed, the non-volatile memory system 100 further includes an error-correction code engine 224 that is configured to detect and correct read errors of the plurality of non-volatile memory cells 127. So, the method further includes the step of determining whether the reading of the threshold voltage of each of the plurality of non-volatile memory cells 127 is successful using the error-correction code engine 224.

Again, the plurality of read parameters includes a plurality of word line voltages applied to each of the plurality of word lines during the reading and corresponding to a plurality of read levels and the non-volatile memory system 100 can further include an offset table 702 including a plurality of offsets based on the present temperature for the plurality of word line voltages. Thus, the method can further include the step of 806 performing a conventional "Dynamic Read" of the threshold voltage of each of the plurality of non-volatile memory cells 127 using the plurality of word line voltages adjusted using the offset table 702 in response to determining that reading the plurality of non-volatile memory cells 127 using the plurality of default read parameters is not successful. The method can also include the step of 808 determining whether performing the conventional "Dynamic Read" of the plurality of non-volatile memory cells 127 using the plurality of word line voltages adjusted using the offset table 702 is successful. The method also includes the step of 810 dynamically testing and adjusting the plurality of read parameters based on whether reading the plurality of non-volatile memory cells 127 using the plurality of read parameters is successful until the plurality of read parameters is determined to result in a successful read in response to determining that reading the plurality of non-volatile memory cells 127 using the plurality of default read parameters is not successful. Once more, if the temperature sensing circuit 115 of the non-volatile memory system 100 is used to sense the present temperature of the non-volatile memory system 100, the method can further include the steps of determining the present temperature of the apparatus using the temperature-sensing circuit, and dynamically testing and adjusting the plurality of read parameters based on the present temperature of the non-volatile memory system 100. Nevertheless, the temperature sensing circuit 115 may not be utilized.

As previously discussed, the non-volatile memory system 100 includes the plurality of sense blocks 50, 51, 52 each connected to one of the plurality of bit lines and including a bit line clamping transistor 508 for applying one of a plurality of bit line voltages to the one of the plurality of bit lines (e.g., bit line 516 of FIG. 7) and the plurality of read parameters includes the plurality of bit line voltages and the plurality of word line voltages applied to each of the plurality of word lines. Each of the plurality of word line voltages corresponds to one of a plurality of read levels (see. FIG. 5). While FIGS. 17 and 19 show that the step of dynamically testing and adjusting the plurality of read parameters following the conventional "Dynamic Read", it should be understood that as shown in FIG. 18, the step of dynamically testing and adjusting the plurality of read parameters may instead follow directly after the read using default read parameters fails.

According to an aspect and best shown in FIG. 17, the step of 810 can include the following sequence of steps. First, 1) applying one of the plurality of bit line voltages to the plurality of bit lines coupled to the plurality of non-volatile memory cells 127 of all of the plurality of sectors (812). The next step of the method is 2) applying one of the plurality of word line voltages to each of the plurality of word lines coupled to each selected one of the plurality of non-volatile memory cells 127 while applying a pass voltage to each of the plurality of word lines coupled to each nonselected others of the plurality of non-volatile memory cells 127 of the all of the plurality of sectors (814). Next, 3) determining whether reading the plurality of non-volatile memory cells 127 using the one of the plurality of bit line voltages and each of the plurality of word line voltages is successful (816). Then, the method can continue by 4) incrementing the one of the plurality of word line voltages in response to determining that reading the plurality of non-volatile memory cells 127 using the one of the plurality of bit line voltages and the one of the plurality of word line voltages is not successful (818). The method can proceed with the step of 5) storing the one of a plurality of bit line voltages and the one of the plurality of word line voltages in response to determining that reading the plurality of non-volatile memory cells 127 using the one of the plurality of bit line voltages and the one of the plurality of word line voltages is successful (820). The method can also include 6) iteratively performing steps 1-5 for all of the plurality of word line voltages (822).

The method continues with the step of 7) incrementing the one of the plurality of bit line voltages and returning to step 1 in response to determining that reading the plurality of non-volatile memory cells 127 using the one of the plurality of bit line voltages and all of the plurality of word line voltages is not successful (824). Next, 8) iteratively performing steps 1-7 for all of the plurality of bit line voltages (826). The method also includes 9) using the one of a plurality of bit line voltages and the one of the plurality of word line voltages for reading in response to determining that reading the plurality of non-volatile memory cells 127 using the one of the plurality of bit line voltages and the one of the plurality of word line voltages is successful (828). The method can then include the step of 9) reporting a read failure in response to determining that reading the plurality of non-volatile memory cells 127 using all of the plurality of bit line voltages and all of the plurality of word line voltages is not successful (830).

According to another aspect and as shown in FIG. 18, the step of 810 can include the following sequence of steps. First, 1) setting a dynamic read flag to zero (834). Next, 2) applying one of the plurality of bit line voltages to the plurality of bit lines coupled to the plurality of non-volatile memory cells 127 of one of the plurality of sectors (836). Then, the method can continue by 3) incrementing the one of the plurality of bit line voltages to a successive one of the plurality of bit line voltages and apply the successive one of the plurality of bit line voltages to a successive one of the plurality of sectors (838). The method can proceed with the step of 4) iteratively repeating step 3 for all of the plurality of sectors (840).

The method can then include the step of 5) applying one of the plurality of word line voltages to each of the plurality of word lines coupled to each selected one of the plurality of non-volatile memory cells 127 while applying a pass voltage $V_{read}$ to each of the plurality of word lines coupled to each nonselected others of the plurality of non-volatile memory cells 127 of the all of the plurality of sectors (842). Next, 6) determining whether reading the plurality of non-volatile memory cells 127 using the plurality of bit line voltages and the one of the plurality of word line voltages is successful individually for each of the plurality of sectors (844). The method proceeds with the step of 7) incrementing the one of the plurality of word line voltages in response to determining that reading the plurality of non-volatile memory cells 127 using the one of the plurality of bit line voltages and the one of the plurality of word line voltages is not successful (846). The method then includes the step of 8) storing one of the plurality of bit line voltages and the one of the plurality of word line voltages and set the dynamic read flag to one in response to determining that reading the plurality of non-volatile memory cells 127 using the one of the plurality of bit line voltages and the one of the plurality of word line voltages is successful (848). The method also includes the step of 9) iteratively performing steps 1-8 for all of the plurality of word line voltages (850).

Continuing to refer to FIG. 18, the method then includes the step of 10) using the one of a plurality of bit line voltages and the one of the plurality of word line voltages for reading in response to determining that reading the plurality of non-volatile memory cells 127 using the one of the plurality of bit line voltages and the one of the plurality of word line voltages is successful (852). The method can also include 11) reporting a read failure in response to determining that reading the plurality of non-volatile memory cells 127 using all of the plurality of bit line voltages and all of the plurality of word line voltages is not successful (854).

As discussed, the non-volatile memory system 100 includes a plurality of sense blocks 50, 51, 52 each connected to one of the plurality of bit lines (e.g., bit line 516 of FIG. 7) and including a bit line clamping transistor 508 for applying one of a plurality of bit line voltages to the one of the plurality of bit lines. So, the plurality of read parameters includes a plurality of sense times in which a bit line current is sensed by each of the plurality of sense blocks 50, 51, 52 on each of the plurality of bit lines while a bit line voltage is applied to each of the plurality of bit lines and a word line voltage of the plurality of word line voltages is applied to each of the plurality of word lines (e.g., WL0, WL1, etc. of FIG. 7) in response to determining that performing the conventional "Dynamic Read" of the plurality of non-volatile memory cells 127 using the plurality of word line voltages adjusted using the offset table 702 is not successful.

Thus, according to yet another aspect and shown in FIG. 19, the step of 810 can include the following sequence of steps. First, 1) applying the bit line voltage to the plurality of bit lines coupled to the plurality of non-volatile memory cells 127 of each of the plurality of sectors (856). Next, 2) applying the word line voltage to each of the plurality of word lines coupled to each selected one of the plurality of non-volatile memory cells 127 while applying a pass voltage $V_{read}$ to each of the plurality of word lines coupled to each nonselected others of the plurality of non-volatile memory cells 127 of the each of the plurality of sectors (858). The method continues with the step of 3) sensing the bit line current in a string of one of the plurality of sectors associated with the selected one of the plurality of non-volatile memory cells 127 for one of the plurality of sense times (860). Next, 4) determining whether reading the plurality of non-volatile memory cells 127 using the one of the plurality of sense times is successful (862). The method continues by 5) storing the one of the plurality of sense times in response to determining that reading the plurality of non-volatile memory cells 127 using the one of the plurality of sense times is successful (864). Then, 6) incrementing the one of the plurality of sense times in response to determining that reading the plurality of non-volatile memory cells 127 using the one of the plurality of sense times is not successful (866). The method also includes the step of 7) iteratively perform steps 1-6 for all of the plurality of sense times.

Still referring to FIG. 19, the method additionally includes 8) using the one of the plurality of sense times for reading in response to determining that reading the plurality of non-volatile memory cells 127 using the one of the plurality of sense times is successful (868). The method also includes the step of 9) report a read failure in response to determining that reading the plurality of non-volatile memory cells 127 using all of the plurality of sense times is not successful (870).

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. An apparatus, comprising:
   a plurality of non-volatile memory cells;
   a control circuit in communication with the plurality of non-volatile memory cells, the control circuit configured to:
      read a threshold voltage of each of the plurality of non-volatile memory cells using a plurality of read parameters being a plurality of default read parameters,
      determine whether reading the plurality of non-volatile memory cells using the plurality of default read parameters is successful,
      in response to reading the plurality of non-volatile memory cells using the plurality of default read parameters being successful, finish the read operation, and
      in response to reading the plurality of non-volatile memory cells using the plurality of default read parameters being unsuccessful, dynamically test and adjust the plurality of read parameters based on whether reading the plurality of non-volatile memory cells using the plurality of read parameters is successful until the plurality of read parameters is determined to result in a successful read.

2. The apparatus as set forth in claim 1, wherein the control circuit includes an error-correction code engine configured to detect and correct read errors of the plurality of non-volatile memory cells and the control circuit is further configured to determine whether the reading of the threshold voltage of each of the plurality of non-volatile memory cells is successful using the error-correction code engine.

3. The apparatus as set forth in claim 1, wherein the plurality of non-volatile memory cells are arranged in a plurality of sectors each comprising at least one string, each of the plurality of non-volatile memory cells include a control gate in communication with one of a plurality of word lines and a drain coupled to one of a plurality of bit lines, the plurality of read parameters includes a plurality of word line voltages applied to each of the plurality of word lines during the reading and corresponding to a plurality of read levels, the control circuit further includes an offset table including a plurality of offsets based on the present temperature for the plurality of word line voltages, and the control circuit is further configured to:
   perform a conventional dynamic read of the threshold voltage of each of the plurality of non-volatile memory cells using the plurality of word line voltages adjusted using the offset table in response to determining that reading the plurality of non-volatile memory cells using the plurality of default read parameters is not successful, and
   determine whether performing the conventional dynamic read of the plurality of non-volatile memory cells using the plurality of word line voltages adjusted using the offset table is successful.

4. The apparatus as set forth in claim 3, further including a plurality of sense blocks each connected to one of the plurality of bit lines and including a bit line clamping transistor for applying one of a plurality of bit line voltages to the one of the plurality of bit lines and wherein the plurality of read parameters includes the plurality of bit line voltages and the plurality of word line voltages and wherein the control circuit is configured to perform the following steps in response to determining that performing the conventional dynamic read of the plurality of non-volatile memory cells using the plurality of word line voltages adjusted using the offset table is not successful:
  1) apply one of the plurality of bit line voltages to the plurality of bit lines coupled to the plurality of non-volatile memory cells of all of the plurality of sectors,
  2) apply one of the plurality of word line voltages to each of the plurality of word lines coupled to each selected one of the plurality of non-volatile memory cells while applying a pass voltage $V_{read}$ to each of the plurality of word lines coupled to each nonselected others of the plurality of non-volatile memory cells of the all of the plurality of sectors,
  3) determine whether reading the plurality of non-volatile memory cells using the one of the plurality of bit line voltages and the one of the plurality of word line voltages is successful,
  4) increment the one of the plurality of word line voltages in response to determining that reading the plurality of non-volatile memory cells using the one of the plurality of bit line voltages and the one of the plurality of word line voltages is not successful,
  5) store the one of a plurality of bit line voltages and the one of the plurality of word line voltages in response to determining that reading the plurality of non-volatile memory cells using the one of the plurality of bit line voltages and the one of the plurality of word line voltages is successful,
  6) iteratively perform steps 1-5 for all of the plurality of bit line voltages,
  7) increment the one of the plurality of bit line voltages and return to step 1 in response to determining that reading the plurality of non-volatile memory cells using the one of the plurality of bit line voltages and all of the plurality of word line voltages is not successful,
  8) iteratively perform steps 1-7 for all of the plurality of bit line voltages,
  9) use the one of a plurality of bit line voltages and the one of the plurality of word line voltages for reading in response to determining that reading the plurality of non-volatile memory cells using the one of the plurality of bit line voltages and the one of the plurality of word line voltages is successful, and
  10) report a read failure in response to determining that reading the plurality of non-volatile memory cells using all of the plurality of bit line voltages and all of the plurality of word line voltages is not successful.

5. The apparatus as set forth in claim 3, further including a plurality of sense blocks each connected to one of the plurality of bit lines and including a bit line clamping transistor for applying one of the plurality of bit line voltages to the one of the plurality of bit lines and wherein the plurality of read parameters includes the plurality of bit line voltages and the plurality of word line voltages and wherein the control circuit is configured to perform the following steps in response to determining that performing the conventional dynamic read of the plurality of non-volatile memory cells using the plurality of word line voltages adjusted using the offset table is not successful:
  1) set a dynamic read flag to zero,
  2) apply one of the plurality of bit line voltages to the plurality of bit lines coupled to the plurality of non-volatile memory cells of one of the plurality of sectors,
  3) increment the one of the plurality of bit line voltages to a successive one of the plurality of bit line voltages and apply the successive one of the plurality of bit line voltages to a successive one of the plurality of sectors,
  4) iteratively repeat step 3 for all of the plurality of sectors,
  5) apply one of the plurality of word line voltages to each of the plurality of word lines coupled to each selected one of the plurality of non-volatile memory cells while applying a pass voltage to each of the plurality of word lines coupled to each nonselected others of the plurality of non-volatile memory cells of the all of the plurality of sectors,
  6) determine whether reading the plurality of non-volatile memory cells using the plurality of bit line voltages and the one of the plurality of word line voltages is successful individually for each of the plurality of sectors,
  7) increment the one of the plurality of word line voltages in response to determining that reading the plurality of non-volatile memory cells using the one of the plurality of bit line voltages and the one of the plurality of word line voltages is not successful,
  8) store one of the plurality of bit line voltages and the one of the plurality of word line voltages and set the dynamic read flag to one in response to determining that reading the plurality of non-volatile memory cells using the one of the plurality of bit line voltages and the one of the plurality of word line voltages is successful,
  9) iteratively perform steps 1-8 for all of the plurality of word line voltages,
  10) use the one of a plurality of bit line voltages and the one of the plurality of word line voltages for reading in response to determining that reading the plurality of non-volatile memory cells using the one of the plurality of bit line voltages and the one of the plurality of word line voltages is successful, and
  11) report a read failure in response to determining that reading the plurality of non-volatile memory cells using all of the plurality of bit line voltages and all of the plurality of word line voltages is not successful.

6. The apparatus as set forth in claim 3, further including a plurality of sense blocks each connected to one of the plurality of bit lines and including a bit line clamping transistor for applying a bit line voltage to the one of the plurality of bit lines and wherein the plurality of read parameters includes a plurality of sense times in which a bit line current is sensed by each of the plurality of sense blocks on each of the plurality of bit lines while a bit line voltage is applied to each of the plurality of bit lines and a word line voltage of the plurality of word line voltages is applied to each of the plurality of word lines and wherein the control circuit is configured to perform the following steps in response to determining that performing the conventional dynamic read of the plurality of non-volatile memory cells using the plurality of word line voltages adjusted using the offset table is not successful:
  1) apply the bit line voltage to the plurality of bit lines coupled to the plurality of non-volatile memory cells of each of the plurality of sectors,
  2) apply the word line voltage to each of the plurality of word lines coupled to each selected one of the plurality of non-volatile memory cells while applying a pass voltage to each of the plurality of word lines coupled to each nonselected others of the plurality of non-volatile memory cells of the each of the plurality of sectors,
  3) sense the bit line current in a string of one of the plurality of sectors associated with the selected one of the plurality of non-volatile memory cells for one of the plurality of sense times, 4) determine whether reading the plurality of non-volatile memory cells using the one of the plurality of sense times is successful,
5) store the one of the plurality of sense times in response to determining that reading the plurality of non-volatile memory cells using the one of the plurality of sense times is successful,
6) increment the one of the plurality of sense times in response to determining that reading the plurality of non-volatile memory cells using the one of the plurality of sense times is not successful,
7) iteratively perform steps 1-6 for all of the plurality of sense times,
8) use the one of the plurality of sense times for reading in response to determining that reading the plurality of non-volatile memory cells using the one of the plurality of sense times is successful, and
9) report a read failure in response to determining that reading the plurality of non-volatile memory cells using all of the plurality of sense times is not successful.

7. The apparatus as set forth in claim 1, wherein the control circuit further includes a temperature-sensing circuit for sensing a present temperature of the apparatus and wherein the control circuit is configured to:
determine the present temperature of the apparatus using the temperature-sensing circuit, and
dynamically test and adjust the plurality of read parameters based on the present temperature of the apparatus.

8. A controller in communication with a plurality of non-volatile memory cells of a non-volatile memory system, the controller configured to:
instruct the non-volatile memory system to read a threshold voltage of each of the plurality of non-volatile memory cells using a plurality of read parameters being a plurality of default read parameters;
receive data from the non-volatile memory system corresponding to reading the threshold voltage of each of the plurality of non-volatile memory cells using the plurality of default read parameters;
determine whether reading the plurality of non-volatile memory cells using the plurality of default read parameters is successful;
in response to reading the plurality of non-volatile memory cells using the plurality of default read parameters being successful, finish the read operation; and
in response to reading the plurality of non-volatile memory cells using the plurality of default read parameters being unsuccessful, instruct the non-volatile memory system to dynamically test and adjust the plurality of read parameters based on whether reading the plurality of non-volatile memory cells using the plurality of read parameters is successful until the plurality of read parameters is determined to result in a successful read.

9. The controller as set forth in claim 8, wherein the controller includes an error-correction engine for detecting and correcting read errors of the plurality of non-volatile memory cells and the controller is further configured to determine whether the reading of the threshold voltage of each of the plurality of non-volatile memory cells is successful using the error-correction code engine.

10. The controller as set forth in claim 8, wherein the plurality of non-volatile memory cells are arranged in a plurality of sectors, each of the plurality of non-volatile memory cells includes a control gate in communication with one of a plurality of word lines and a drain coupled to one of a plurality of bit lines, the plurality of read parameters includes a plurality of word line voltages applied to each of the plurality of word lines during the reading and corresponding to a plurality of read levels the controller, and the controller is further configured to iteratively instruct the non-volatile memory system to read the threshold voltage of each of the plurality of non-volatile memory cells using a single one of a plurality of bit line voltages applied to the plurality of bit lines and one of the plurality of word line voltages applied to each of the plurality of word lines for all of the plurality of sectors, with only the one of the plurality of bit line voltages and the one of the plurality of word line voltages being attempted by the non-volatile memory system in one unit time.

11. The controller as set forth in claim 8, wherein the plurality of non-volatile memory cells are arranged in a plurality of sectors, each of the plurality of non-volatile memory cells includes a control gate in communication with one of a plurality of word lines and a drain coupled to one of a plurality of bit lines, the plurality of read parameters includes a plurality of word line voltages applied to each of the plurality of word lines during the reading and corresponding to a plurality of read levels the controller, and the controller is further configured to iteratively instruct the non-volatile memory system to read the threshold voltage of each of the plurality of non-volatile memory cells using a different one of a plurality of bit line voltages applied to the plurality of bit lines individually for each of the plurality of sectors while one of the plurality of word line voltages is applied to each of the plurality of word lines for all of the plurality of sectors, with all of the plurality of bit line voltages being concurrently attempted and the one of the plurality of word line voltages being attempted by the non-volatile memory system in one unit time.

12. The controller as set forth in claim 8, wherein the plurality of non-volatile memory cells are arranged in a plurality of sectors each comprising at least one string, each of the plurality of non-volatile memory cells includes a control gate in communication with one of a plurality of word lines and a drain coupled to one of a plurality of bit lines, the plurality of read parameters includes a plurality of word line voltages applied to each of the plurality of word lines during the reading and corresponding to a plurality of read levels the controller, and the controller is further configured to iteratively instruct the non-volatile memory system to read the threshold voltage of each of the plurality of non-volatile memory cells using one of a plurality of bit line voltages applied to the plurality of bit lines and one of the plurality of word line voltages applied to each of the plurality of word lines while the non-volatile memory system senses a bit line current for one of a plurality of sense times, with the one of the plurality of bit line voltages and the one of the plurality of word line voltages being attempted by the non-volatile memory system for one of the plurality of sense times in one unit time.

13. The controller as set forth in claim 8, wherein the non-volatile memory system includes a temperature-sensing circuit for sensing a present temperature of the non-volatile memory system and wherein the controller is further configured to determine the present temperature of the non-volatile memory system using the temperature-sensing circuit, and instructs the non-volatile memory system to dynamically test and adjust the plurality of read parameters based on the present temperature of the non-volatile memory system.

14. A method of operating a plurality of non-volatile memory cells of a non-volatile memory system, the method comprising the steps of:

reading a threshold voltage of each of the plurality of non-volatile memory cells using a plurality of read parameters being a plurality of default read parameters;

determining whether reading the plurality of non-volatile memory cells using the plurality of default read parameters is successful;

in response to determining that reading the plurality of non-volatile memory cells using the plurality of default read parameters is successful, finishing the read operation; and in response to determining that reading the plurality of non-volatile memory cells using the plurality of default read parameters is unsuccessful, dynamically testing and adjusting the plurality of read parameters based on whether reading the plurality of non-volatile memory cells using the plurality of read parameters is successful until the plurality of read parameters is determined to result in a successful read.

15. The method as set forth in claim 14, wherein the non-volatile memory system further includes an error-correction code engine configured to detect and correct read errors of the plurality of non-volatile memory cells and the method further includes the step of determining whether the reading of the threshold voltage of each of the plurality of non-volatile memory cells is successful using the error-correction code engine.

16. The method as set forth in claim 14, wherein the plurality of non-volatile memory cells are arranged in a plurality of sectors each comprising at least one string, each of the plurality of non-volatile memory cells include a control gate in communication with one of a plurality of word lines and a drain coupled to one of a plurality of bit lines, the plurality of read parameters includes a plurality of word line voltages applied to each of the plurality of word lines during the reading and corresponding to a plurality of read levels, and the non-volatile memory system further includes a temperature-sensing circuit for sensing a present temperature of the apparatus and an offset table including a plurality of offsets based on the present temperature for the plurality of word line voltages, and the method further includes the steps of:

performing a conventional dynamic read of the threshold voltage of each of the plurality of non-volatile memory cells using the plurality of word line voltages adjusted using the offset table in response to determining that reading the plurality of non-volatile memory cells using the plurality of default read parameters is not successful, and determining whether performing the conventional dynamic read of the plurality of non-volatile memory cells using the plurality of word line voltages adjusted using the offset table is successful.

17. The method as set forth in claim 16, wherein the non-volatile memory system includes a plurality of sense blocks each connected to one of the plurality of bit lines and including a bit line clamping transistor for applying one of a plurality of bit line voltages to the one of the plurality of bit lines and the plurality of read parameters includes the plurality of bit line voltages and the plurality of word line voltages and in response to determining that performing the conventional dynamic read of the plurality of non-volatile memory cells using the plurality of word line voltages adjusted using the offset table is not successful the method further includes the steps of:

1) applying one of the plurality of bit line voltages to the plurality of bit lines coupled to the plurality of non-volatile memory cells of all of the plurality of sectors;

2) applying one of the plurality of word line voltages to each of the plurality of word lines coupled to each selected one of the plurality of non-volatile memory cells while applying a pass voltage to each of the plurality of word lines coupled to each nonselected others of the plurality of non-volatile memory cells of the all of the plurality of sectors;

3) determining whether reading the plurality of non-volatile memory cells using the one of the plurality of bit line voltages and each of the plurality of word line voltages is successful;

4) incrementing the one of the plurality of word line voltages in response to determining that reading the plurality of non-volatile memory cells using the one of the plurality of bit line voltages and the one of the plurality of word line voltages is not successful;

5) storing the one of a plurality of bit line voltages and the one of the plurality of word line voltages in response to determining that reading the plurality of non-volatile memory cells using the one of the plurality of bit line voltages and the one of the plurality of word line voltages is successful;

6) iteratively performing steps 1-5 for all of the plurality of word line voltages;

7) incrementing the one of the plurality of bit line voltages and returning to step 1 in response to determining that reading the plurality of non-volatile memory cells using the one of the plurality of bit line voltages and all of the plurality of word line voltages is not successful;

8) iteratively performing steps 1-7 for all of the plurality of bit line voltages;

9) using the one of a plurality of bit line voltages and the one of the plurality of word line voltages for reading in response to determining that reading the plurality of non-volatile memory cells using the one of the plurality of bit line voltages and the one of the plurality of word line voltages is successful, and 9) reporting a read failure in response to determining that reading the plurality of non-volatile memory cells using all of the plurality of bit line voltages and all of the plurality of word line voltages is not successful.

18. The method as set forth in claim 16, wherein the non-volatile memory system includes a plurality of sense blocks each connected to one of the plurality of bit lines and including a bit line clamping transistor for applying one of a plurality of bit line voltages to the one of the plurality of bit lines and the plurality of read parameters includes the plurality of bit line voltages and the plurality of word line voltages and in response to determining that performing the conventional dynamic read of the plurality of non-volatile memory cells using the plurality of word line voltages adjusted using the offset table is not successful the method further includes the steps of:

1) setting a dynamic read flag to zero, 2) applying one of the plurality of bit line voltages to the plurality of bit lines coupled to the plurality of non-volatile memory cells of one of the plurality of sectors, 3) incrementing the one of the plurality of bit line voltages to a successive one of the plurality of bit line voltages and apply the successive one of the plurality of bit line voltages to a successive one of the plurality of sectors, 4) iteratively repeating step 3 for all of the plurality of sectors, 5) applying one of the plurality of word line voltages to each of the plurality of word lines coupled to each selected one of the plurality of non-volatile memory cells while applying a pass voltage to each of the plurality of word lines coupled to each nonselected others of the plurality of non-volatile memory cells of the all of the plurality of sectors, 6) determining whether reading the plurality of non-volatile memory cells using the plurality of bit line voltages and the one of the plurality of word line voltages is successful individually for each of the plurality of sectors, 7) incrementing the one of the plurality of word line voltages in response to determining that reading the plurality of non-volatile memory cells using the one of the plurality of bit line voltages and the one of the plurality of word line voltages is not successful, 8) storing one of the plurality of bit line voltages and the one of the plurality of word line voltages and set the dynamic read flag to one in response to determining that reading the plurality of non-volatile memory cells using the one of the plurality of bit line voltages and the one of the plurality of word line voltages is successful, 9) iteratively performing steps 1-8 for all of the plurality of word line voltages, and 10) using the one of a plurality of bit line voltages and the one of the plurality of word line voltages for reading in response to determining that reading the plurality of non-volatile memory cells using the one of the plurality of bit line voltages and the one of the plurality of word line voltages is successful, and 11) reporting a read failure in response to determining that reading the plurality of non-volatile memory cells using all of the plurality of bit line voltages and all of the plurality of word line voltages is not successful.

19. The method as set forth in claim 16, wherein the non-volatile memory system further includes a plurality of sense blocks each connected to one of the plurality of bit lines and including a bit line clamping transistor for applying a bit line voltage to the one of the plurality of bit lines and wherein the plurality of read parameters includes a plurality of sense times in which a bit line current is sensed by each of the plurality of sense blocks on each of the plurality of bit lines while a bit line voltage is applied to each of the plurality of bit lines and one of the plurality of word line voltages is applied to each of the plurality of word lines and in response to determining that performing the conventional dynamic read of the plurality of non-volatile memory cells using the plurality of word line voltages adjusted using the offset table is not successful the method further includes the steps of:

1) applying the bit line voltage to the plurality of bit lines coupled to the plurality of non-volatile memory cells of each of the plurality of sectors, 2) applying the word line voltage to each of the plurality of word lines coupled to each selected one of the plurality of non-volatile memory cells while applying a pass voltage to each of the plurality of word lines coupled to each nonselected others of the plurality of non-volatile memory cells of the each of the plurality of sectors, 3) sensing the bit line current in a string of one of the plurality of sectors associated with the selected one of the plurality of non-volatile memory cells for one of the plurality of sense times, 4) determining whether reading the plurality of non-volatile memory cells using the one of the plurality of sense times is successful, 5) storing the one of the plurality of sense times in response to determining that reading the plurality of non-volatile memory cells using the one of the plurality of sense times is successful, 6) incrementing the one of the plurality of sense times in response to determining that reading the plurality of non-volatile memory cells using the one of the plurality of sense times is not successful, 7) iteratively performing steps 1-6 for all of the plurality of sense times, 8) using the one of the plurality of sense times for reading in response to determining that reading the plurality of non-volatile memory cells using the one of the plurality of sense times is successful, and 9) reporting a read failure in response to determining that reading the plurality of non-volatile memory cells using all of the plurality of sense times is not successful.

20. The method as set forth in claim 14, wherein the non-volatile memory system includes a temperature-sensing circuit for sensing a present temperature of the non-volatile memory system and the method further includes the steps of:

determining the present temperature of the apparatus using the temperature-sensing circuit, and dynamically testing and adjusting the plurality of read parameters based on the present temperature of the apparatus.

* * * * *